(12) United States Patent
Hisamoto et al.

(10) Patent No.: US 7,102,405 B2
(45) Date of Patent: Sep. 5, 2006

(54) PULSE-WIDTH MODULATION CIRCUIT AND SWITCHING AMPLIFIER USING THE SAME

(75) Inventors: Sadatoshi Hisamoto, Neyagawa (JP); Koji Takatori, Neyagawa (JP)

(73) Assignee: Onkyo Corporation, Osaka (JP)

( * ) Notice: Subject to any disclaimer, the term of this patent is extended or adjusted under 35 U.S.C. 154(b) by 44 days.

(21) Appl. No.: 10/911,021

(22) Filed: Aug. 3, 2004

(65) Prior Publication Data
US 2005/0029994 A1 Feb. 10, 2005

(30) Foreign Application Priority Data
Aug. 8, 2003 (JP) ............... 2003-289862

(51) Int. Cl.
*H03K 3/17* (2006.01)
(52) U.S. Cl. .................. 327/172; 327/423; 327/494
(58) Field of Classification Search ........ 327/172–176, 327/423, 424, 588, 494, 496, 497, 508; 330/10
See application file for complete search history.

(56) References Cited

U.S. PATENT DOCUMENTS

| | | | | |
|---|---|---|---|---|
| 4,415,863 A | * | 11/1983 | Tokumo | 330/10 |
| 4,550,308 A | * | 10/1985 | Tokura et al. | 341/167 |
| 5,014,016 A | * | 5/1991 | Anderson | 330/10 |
| 5,021,936 A | * | 6/1991 | Nishizawa et al. | 363/41 |
| 5,262,733 A | * | 11/1993 | Nakajima et al. | 330/10 |
| 5,387,875 A | * | 2/1995 | Tateno | 330/10 |
| 5,767,740 A | * | 6/1998 | Fogg | 330/10 |
| 5,917,369 A | * | 6/1999 | Nguyen | 330/10 |
| 6,147,545 A | * | 11/2000 | Marshall | 327/424 |
| 6,339,360 B1 | * | 1/2002 | Santillano | 330/10 |
| 6,351,184 B1 | * | 2/2002 | Miao et al. | 330/207 A |
| 6,753,717 B1 | * | 6/2004 | Inoue et al. | 327/423 |
| 6,788,137 B1 | * | 9/2004 | Morita | 330/10 |
| 6,828,836 B1 | * | 12/2004 | Barrow et al. | 327/172 |

FOREIGN PATENT DOCUMENTS

JP 2003-179445 6/2003

* cited by examiner

*Primary Examiner*—Timothy P. Callahan
*Assistant Examiner*—Hai L. Nguyen
(74) *Attorney, Agent, or Firm*—Hamre, Schumann, Mueller & Larson, P.C.

(57) ABSTRACT

A pulse-width modulation circuit converts an input signal into a pulse signal to be supplied to a switch amplifying circuit. The modulation circuit includes a comparison signal generator, an amplitude controller for modulating a comparison signal from the signal generator, and a comparator for comparing the modulated comparison signal and the input signal. The comparator outputs a signal whose level is inverted in accordance with the level of the input signal. The signal outputted from the comparator is supplied to the switch amplifying circuit.

12 Claims, 20 Drawing Sheets

PULSE-WIDTH MODULATION CIRCUIT AND SWITCHING AMPLIFIER USING THE SAME

BACKGROUND OF THE INVENTION

1. Field of the Invention

The present invention relates to a pulse-width modulation (PWM) circuit and a switching amplifier using the PWM circuit.

2. Description of the Related Art

A conventional switching amplifier (e.g. an audio amplifier) is disclosed in JP-A-2003-179445, for example. The amplifier includes a pulse-width modulation circuit (PWM circuit) and a power amplifying circuit. The PWM circuit performs pulse-width modulation on inputted signals and outputs modulated signals to the power amplifying circuit, provided with a plurality of switches.

In such a switching amplifier, PWM signals are supplied to the power amplifying circuit from the PWM circuit for the purposes of controlling the voltage applied across the load (e.g. a loudspeaker). In the switching amplifier, the duration of the power voltage application to the load is varied. In this manner, the voltage applied to the load is virtually variable.

FIG. 20 is a block diagram showing a switching amplifier incorporating a conventional PWM circuit. According to this switching amplifier, as the user is adjusting the volume by operating the volume control knob (not shown) associated with a variable resistor 40, the amplitude of an audio signal (i.e. an input signal outputted from the audio signal source AU) is varied. Then, the audio signal is inputted to a PWM circuit 41, where the signal is modulated to a pulse signal having different time-widths corresponding to the amplitudes.

The output from the PWM circuit 41 is inputted to a power amplifying circuit 42. The power amplifying circuit 42 converts the input signal to a pulse signal having different levels of power source voltage corresponding to the level of amplitude. Then, the signal goes through a low pass filter LPF to remove high-frequency components, and the signal is outputted to the load L (e.g. a loudspeaker).

In the above switching amplifier, the amplitude of the audio signal is varied by the variable resistor 40, which is connected to the audio signal source AU. However, this method may suffer the following problem. Specifically, because the variable resistor 40 varies the audio signal amplitude directly, input impedance as viewed toward the audio signal source AU (signal source impedance) is also varied. The variation of the audio signal amplitude affects switching amplifier gain characteristics and S/N ratio. For example, while the noise level remains unchanged, the audio signal level is decreased. Unfavorably, this leads to a poor S/N ratio.

SUMMARY OF THE INVENTION

The present invention has been proposed under the circumstances described above. It is, therefore, an object of the present invention to provide a PWM circuit capable of varying the audio signal amplitude without altering the input impedance as viewed toward the input signal source.

According to a first aspect of the present invention, there is provided a pulse-width modulation (PWM) circuit connected to a power amplifying circuit that includes a plurality of switches operated to vary the duration of power application to a load. The load may be a loudspeaker, for example. The modulation circuit converts an input signal into a pulse signal to be supplied to the power amplifying circuit. The modulation circuit comprises: a comparison signal generator that generates a comparison signal having a prescribed period; an amplitude controller that controls an amplitude of the comparison signal; and a comparator that compares the comparison signal and the input signal after the amplitude of the comparison signal is controlled. The comparator outputs a signal whose level is inverted in accordance with a relative level of the input signal with respect to the comparison signal. The outputted signal from the comparator is supplied to the power amplifying circuit.

Preferably, the comparison signal may be a triangular (such as isosceles triangle) wave signal.

Preferably, the pulse-width modulation circuit of the first aspect may further comprise a noise remover for removing noise (such as impulse noise) from the input signal.

Preferably, the noise remover may include an integrating circuit that performs integration on the input signal and a sample hold circuit that performs sample-holding on the integrated input signal.

The pulse-width modulation circuit may further comprise at least one additional comparator connected to the comparison signal generator. The additional comparator receives an additional input signal and compares the comparison signal generated by the comparison signal generator and the additional input signal after the amplitude of the comparison signal is controlled. The additional comparator outputs a signal having a level inverted in accordance with a relative level of the additional input signal with respect to the comparison signal. The outputted signal is supplied to an additional power amplifying circuit.

According to a second aspect of the present invention, there is provided a pulse-width modulation circuit connected to a power amplifying circuit that includes a plurality of switches operated to vary the duration of power application to a load. The modulation circuit converts an input signal into a pulse signal to be supplied to the power amplifying circuit. The modulation circuit comprises: a first comparison signal generator that generates a first comparison signal having a prescribed period; a second comparison signal generator that generates a second comparison signal having the same period as the first comparison signal, the second comparison signal being in inverted relation to the first comparison signal; an amplitude controller that controls an amplitude of the first comparison signal and an amplitude of the second comparison signal; a first comparator that compares the first comparison signal and the input signal after the amplitude of the first comparison signal is controlled; and a second comparator that compares the second comparison signal and the input signal after the amplitude of the second comparison signal is controlled. The first comparator outputs a signal whose level is inverted in accordance with a relative level of the input signal with respect to the first comparison signal. The outputted signal from the first comparator is supplied to the power amplifying circuit. Likewise, the second comparator outputs a signal whose level is inverted in accordance with a relative level of the input signal with respect to the second comparison signal. The outputted signal from the second comparator is also supplied to the power amplifying circuit.

Preferably, each of the first comparison signal and the second comparison signal may be a sawtooth wave signal, the waveform of which resembles a tooth of a saw and may be characterized by a slow rise time and a sharp fall or by a slow fall time and a sharp rise.

Preferably, the pulse-width modulation circuit of the second aspect may further comprise a noise remover for removing noise from the input signal.

Preferably, the noise remover may include an integrating circuit that performs integration on the input signal and a sample hold circuit that performs sample-holding on the integrated input signal.

The pulse-width modulation circuit of the second aspect may further comprise at least one additional first comparator and at least one additional second comparator. The additional first comparator is connected to the first comparison signal generator, while the additional second comparator is connected to the second comparison signal generator. The additional first comparator and the additional second comparator receive an additional input signal. The additional first comparator compares the first comparison signal and the additional input signal after the amplitude of the first comparison signal is controlled, while the additional second comparator compares the second comparison signal and the additional input signal after the amplitude of the second comparison signal is controlled. The additional first comparator outputs a signal having a level inverted in accordance with a relative level of the additional input signal with respect to the first comparison signal. The outputted signal is supplied to an additional power amplifying circuit. The additional second comparator outputs a signal having a level inverted in accordance with a relative level of the additional input signal with respect to the second comparison signal. The outputted signal is supplied to the additional power amplifying circuit.

According to a third aspect of the present invention, there is provided a pulse-width modulation circuit connected to a power amplifying circuit that includes a plurality of switches operated to vary the duration of power application to a load. The modulation circuit converts an input signal into a pulse signal to be supplied to the power amplifying circuit. The modulation circuit comprises: a comparison signal generator that generates a comparison signal having a prescribed period; an amplitude controller that controls an amplitude of the comparison signal; a first comparator that compares the comparison signal and the input signal after the amplitude of the comparison signal is controlled, the first comparator outputting a signal having a level inverted in accordance with a relative level of the input signal with respect to the comparison signal; an input signal inverter for inverting the input signal; and a second comparator that compares the comparison signal and the inverted input signal after the amplitude of the comparison signal is controlled, the second comparator outputting a signal having a level inverted in accordance with a relative level of the input signal with respect to the comparison signal. The signal outputted from the first comparator and the signal outputted from the second comparator are supplied to the power amplifying circuit.

Preferably, the comparison signal may be a sawtooth wave signal.

Preferably, the pulse-width modulation circuit of the third aspect may further comprise a noise remover for removing noise from the input signal.

Preferably, the noise remover may include an integrating circuit and a sample hold circuit, the former designed to perform integration on the input signal, the latter designed to perform sample-holding on the integrated input signal.

Preferably, the pulse-width modulation circuit of the third aspect may further comprise at least one additional first comparator, at least one additional second comparator, and at least one additional input signal inverter. The additional first and second comparators are connected to the comparison signal generator, while the additional input signal inverter is connected between the additional first comparator and the additional second comparator. The additional first comparator receives an additional input signal and compares the comparison signal and the additional input signal after the amplitude of the comparison signal is controlled. Then, the additional first comparator outputs a signal having a level inverted in accordance with a relative level of the additional input signal with respect to the comparison signal. The outputted signal is supplied to an additional power amplifying circuit. The additional input signal inverter inverts the additional input signal. The additional second comparator compares the comparison signal and the inverted additional input signal after the amplitude of the comparison signal is controlled. Then, the additional second comparator outputs a signal having a level inverted in accordance with a relative level of the inverted additional input signal with respect to the comparison signal. The outputted signal is supplied to the additional power amplifying circuit.

According to the present invention, a switching amplifier may be provided, which includes any one of the above-mentioned three pulse-width modulation circuits.

Other features and advantages of the present invention will become apparent from the detailed description given below with reference to the accompanying drawings.

DETAILED DESCRIPTION OF THE PREFERRED EMBODIMENTS

Preferred embodiments of the present invention will be described below with reference to the accompanying drawings.

Figure 1:
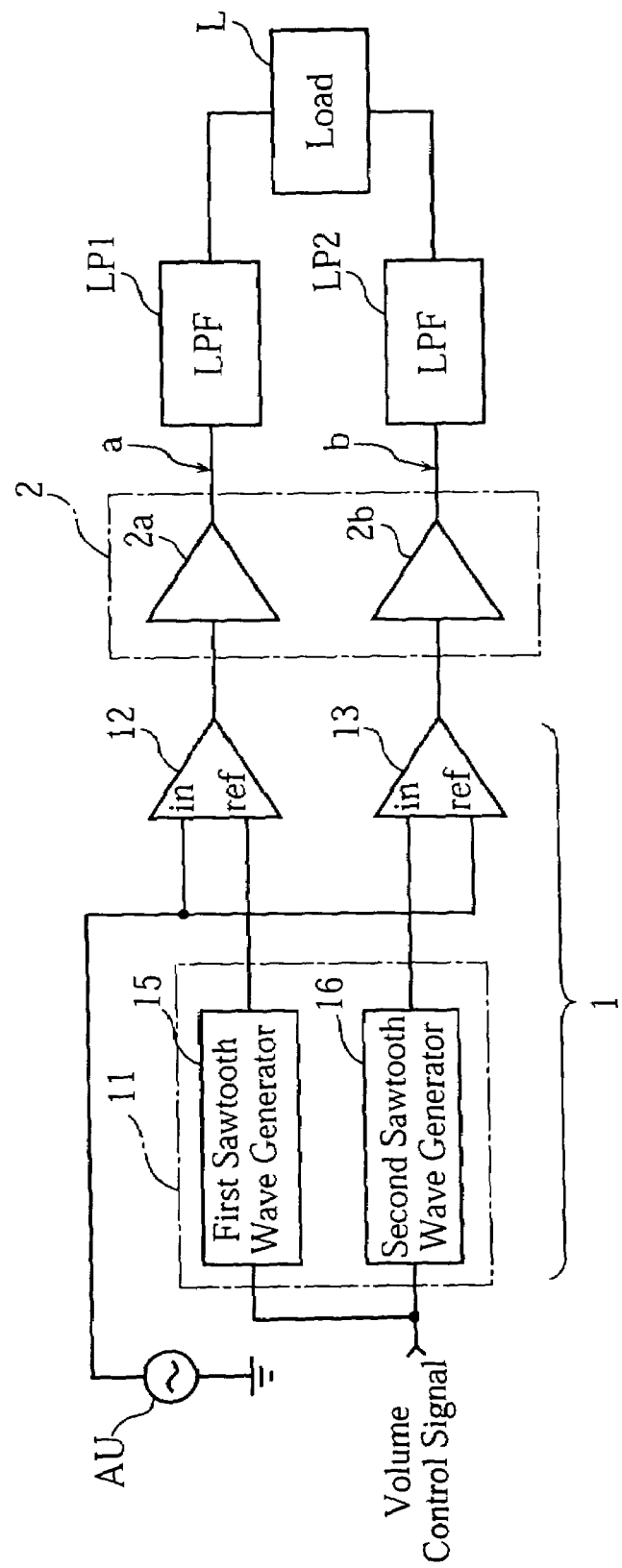
FIG. 1 is a block diagram of a switching amplifier including a PWM circuit according to a first embodiment of the present invention.

FIG. 1 is a block diagram of a switching amplifier including a pulse-width modulation (PWM) circuit according to a first embodiment of the present invention. The switching amplifier may be used as an audio amplifier, for example.

The switching amplifier is disposed between an audio signal source AU (on the left side in FIG. 1) and a load L (on the right side). The load L may be a loudspeaker, for example. The switching amplifier includes a PWM circuit 1, a power amplifying circuit 2, a first low pass filter LP1, and a second low pass filer LP2. The PWM circuit 1 is connected to the power amplifying circuit 2 which in turn is connected to the first and the second low pass filters LP1, LP2. The first low pass filter LP1 is connected to one terminal (not shown) of the load L, while the second low pass filter LP2 is connected to the other terminal (not shown) of the same load.

As described in detail below, an audio signal from the audio signal source AU is inputted to the switching amplifier, to be subjected to pulse-width modulation. Then, based on the modulated signal, the voltage applied across the load L is controlled.

Figure 2:
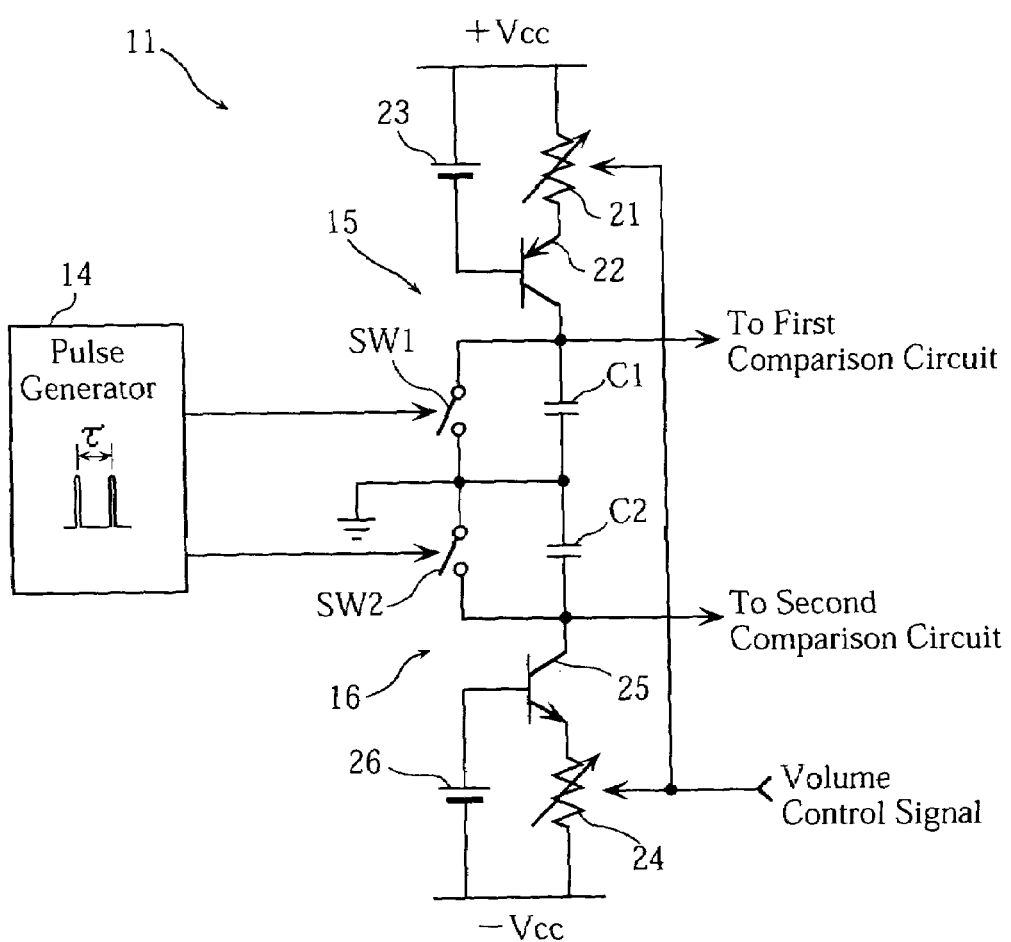
FIG. 2 is a circuit diagram of a comparative signal generating circuit in FIG. 1.

Specifically, the PWM circuit 1 performs pulse-width modulation on an audio signal supplied as input signal from the audio signal source AU. To this end, as shown in FIG. 1, the PWM circuit 1 includes a comparison signal generation circuit 11, a first comparison circuit 12 and a second comparison circuit 13. FIG. 2 shows the details of the comparison signal generation circuit 11. The comparison signal generation circuit 11, which is a constant-current circuit, includes a pulse generation circuit 14, a first sawtooth wave generation circuit 15 (see also FIG. 1), and a second sawtooth wave generation circuit 16 (see also FIG. 1).

The pulse generation circuit 14 generates a pulse signal consisting of a number of pulses (turned-on voltage) at a regular interval. The pulse signal is supplied to both the first sawtooth wave generation circuit 15 and the second sawtooth wave generation circuit 16.

The first sawtooth wave generation circuit 15 generates a first sawtooth wave (See waveform A in FIG. 3) which appears on the positive side with respect to the ground potential (or the reference potential). The first sawtooth wave may have a waveform which, for example, rises from the ground potential with a certain inclination, and then decreases sharply to the ground potential.

Figure 3:
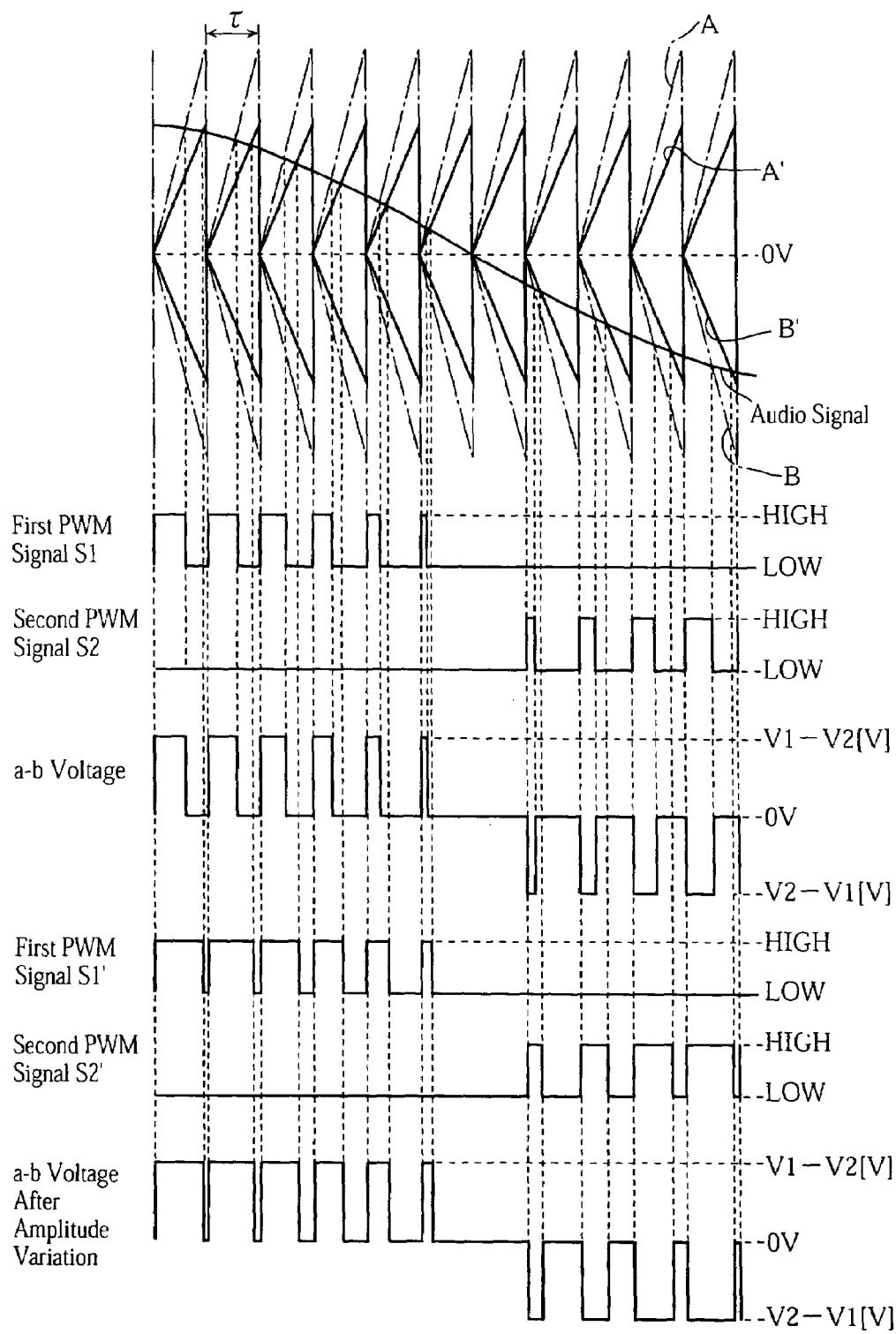
FIG. 3 is a waveform chart of outputs from a power amplifying circuit in FIG. 1.

The first sawtooth wave generation circuit 15 includes a first switch SW1 connected to the pulse generation circuit 14. The first switch SW1 is turned ON and OFF by the pulse signal from the pulse generation circuit 14. The first switch SW1 operates in association with a second switch SW2 which is part of the second sawtooth wave generation circuit 16. A first capacitor C1 is connected in parallel to the first switch SW1. The first capacitor C1 provides an electric charge necessary for the generation of the first sawtooth wave. Specifically, on one hand, the first sawtooth wave generation circuit 15 charges the first capacitor C1 by supplying a charge current (a collector current from a first transistor 22) from a supply circuit, and on the other hand, turns ON the first switch SW1 at a prescribed frequency in accordance with the pulse signal outputted from the pulse generation circuit 14, thereby causing an instantaneous discharge from the first capacitor C1. By repeating this cycle of charging and discharging, the first sawtooth wave represented by a waveform A in FIG. 3 is outputted from two ends of the first capacitor C1.

An end of the first capacitor C1 is connected to a supply circuit which supplies a positive voltage. This supply circuit includes a first variable resistor 21, a first transistor 22 of PNP type and a DC voltage source 23. The first variable resistor 21 has an end connected to a power source voltage Vcc and another end connected to the emitter terminal of the first transistor 22. The first variable resistor 21 receives a volume control signal from outside, and thereby varies its internal resistance value, which then varies the value of a current supplied to the emitter of the first transistor 22 (the charge current of the first capacitor C1) based on the volume control signal. Specifically, if the volume control signal is for a decreased level of the signal, the resistance value of the first variable resistor 21 is decreased and the charge current to the first capacitor C1 is increased. If the volume control signal is for an increased level of the signal, the resistance value of the first variable resistor 21 is increased and the charge current to the first capacitor C1 is decreased. The first transistor 22 has its base terminal connected to the DC voltage source 23, and its collector terminal connected to an end of the first capacitor C1 as well as to the first comparison circuit 12 described above. The other end of the first capacitor C1 is grounded.

On the other hand, the second sawtooth wave generation circuit 16 generates a second sawtooth wave (See waveform B in FIG. 3) which appears on the negative side with respect to the ground potential. The second sawtooth wave has the same period but inversed waveform as of the first sawtooth wave with respect to the ground potential. In other words, the first sawtooth wave and the second sawtooth wave are mirror symmetric to each other with respect to the ground potential line. The second sawtooth wave has a waveform which, for example, falls from the ground potential at a certain inclination for some time, and then rises sharply to the ground potential.

The second sawtooth wave generation circuit 16 include a second switch SW2 connected to the pulse generation circuit 14. The second switch SW2 is turned ON and OFF by the pulse signal from the pulse generation circuit 14. The second switch SW2 has a second capacitor C2 connected in parallel thereto. The second capacitor C2 provides an electric charge necessary for the generation of the second sawtooth wave. Specifically, on one hand, the second sawtooth wave generation circuit 16 charges the second capacitor C2 by supplying a charge current (a collector current from a second transistor 25) from a supply circuit to be described later, and on the other hand, turns ON the second switch SW2 at a prescribed frequency in accordance with the pulse signal outputted from the pulse generation circuit 14, thereby causing an instantaneous discharge from the second capacitor C2. By repeating this cycle of charging and discharging, the second sawtooth wave represented by a waveform B in FIG. 3 is outputted from two ends of the second capacitor C2. It should be appreciated that as has been described, waveform generating operation by the second sawtooth wave generation circuit 16 is identical with that of the first sawtooth wave generation circuit 15, and due to the circuit construction, voltages applied to the first capacitor C1 and the second capacitor C2 are of opposite directions to each other (+Vcc and −Vcc). Thus, the second sawtooth wave outputted from the second sawtooth wave generation circuit 16 has an identical period with that of the first sawtooth wave outputted from the first sawtooth wave generation circuit 15, and the two waveforms are in an inversed relationship with respect to the ground potential.

An end of the second capacitor C2 is connected to a supply circuit which supplies a negative voltage. This supply circuit includes a second variable resistor 24, a second transistor 25 of NPN type and a DC voltage source 26. The second variable resistor 24 has an end connected to a power source voltage −Vcc and another end connected to the emitter terminal of the second transistor 25. As with the first variable resistor 21, the second variable resistor 24 receives a volume control signal from outside, and thereby varies its internal resistance value, which then varies the value of current supplied to the second transistor 25, based on the volume control signal. The second transistor 25 has its base terminal connected to the DC voltage source 26, and its collector terminal connected to an end of the second capacitor C2 as well as to the second comparison circuit 13. The other end of the second capacitor C2 is grounded.

According to the circuit construction in FIG. 2, when the first switch SW1 is turned OFF, a first supply circuit including the first variable resistor 21, the first transistor 22 and the DC voltage source 23 supplies the first capacitor C1 with a charge current (a positive charge), and the first capacitor C1 is charged at a rate determined by the amount of this charge current. On the other hand, when the first switch SW1 is turned ON, the charge in the first capacitor C1 is discharged instantaneously via the first switch SW1. Since the pulse generation circuit 14 outputs a pulse signal which turns ON the first switch SW1 at a prescribed period τ (See FIG. 3), the first capacitor C1 repeats a cycle of charging for the period of τ followed by the instantaneous discharging. This causes the voltage between the ends of the first capacitor C1 to vary as represented by a waveform A or A' in FIG. 3. The voltage waveform is outputted as the first sawtooth wave.

It should be noted here that when the charge current supplied from the first supply circuit to the first capacitor C1 varies, the rate at which the charge voltage rises during the period τ varies accordingly. The patterns A and A' in FIG. 3 illustrate such a variation. The first sawtooth wave A' is a result of generation by a smaller charging current than the current used for generating the first sawtooth wave A.

Likewise, when the second switch SW2 is turned OFF, a second supply circuit including the second variable resistor 24, the second transistor 25 and the DC voltage source 26 supplies the second capacitor C2 with a charge current (a negative charge), and the second capacitor C2 is charged at a rate determined by the amount of this charge current. On the other hand, when the second switch SW2 is turned ON, the charge in the second capacitor C2 is discharged instantaneously via the second switch SW2. Since the pulse generation circuit 14 outputs the same pulse signal to the second switch SW2 as the signal which drives the first switch SW1, the second capacitor C2 repeats a cycle of charging for the period of τ followed by the instantaneous discharging. This causes the voltage between the ends of the second capacitor C2 to vary as represented by a waveform B or B' in FIG. 3. The voltage waveform is outputted as the second sawtooth wave.

Since the second capacitor C2 is supplied with −Vcc and the direction of the charge is in the reverse direction from the direction in the first capacitor C1, the second capacitor C2 has a negative charging voltage between its ends. Further, since the first variable resistor 21 and the second variable resistor 24 are controlled by the same volume control signal so that both resistor has generally the same value, i.e. both of the charging currents are generally identical with each other, a voltage change rate at the ends of the second capacitor C2 during the period τ (the gradient of the waveform B in FIG. 3) is generally the same as of the voltage change rate between the ends of the first capacitor C1 (the gradient of the waveform A in FIG. 3), differing only in the direction of charge. Note that the second sawtooth wave B' is a waveform generated in the second capacitor C2 when the waveform A' is generated in the first capacitor C1.

Returning to FIG. 1, the first comparison circuit 12 compares the audio signal from the audio signal source AU with the first sawtooth wave from the first sawtooth wave generation circuit 15, and outputs a signal in which signal level is inversed in accordance with the level of input signal with respect to the first sawtooth wave. The first comparison circuit 12 has an input terminal "in" supplied with the audio signal, and a reference terminal "ref" supplied with the first sawtooth wave. For example, the first comparison circuit 12 outputs a HIGH level signal from its output terminal when the audio signal is greater than the first sawtooth wave, while outputting a LOW level signal from its output terminal when the audio signal is smaller than the first sawtooth wave. The output terminal of the first comparison circuit 12 is connected to a first power amplifying circuit 2a (to be described later) of the power amplifying circuit 2. Therefore, the first power amplifying circuit 2a is supplied with a first PWM signal S1 shown in FIG. 3.

The second comparison circuit 13 compares the audio signal from the audio signal source AU with the second sawtooth wave from the second sawtooth wave generation circuit 16, and outputs a signal in which signal level is inversed in accordance with the level of input signal with respect to the second sawtooth wave. Differing from the first comparison circuit 12, the second comparison circuit 13 has an input terminal "in" supplied with the second sawtooth wave, and a reference terminal "ref" supplied with the audio signal. For example, in the second comparison circuit 13, a HIGH level signal is outputted from the output terminal of the second comparison circuit 13 when the audio signal is smaller than the first sawtooth wave, whereas a LOW level signal is outputted from the output terminal of the second comparison circuit 13 when the audio signal is greater than the first sawtooth wave. The output terminal of the second comparison circuit 13 is connected to a second power amplifying circuit 2b (to be described later) of the power amplifying circuit 2. Thus, the second power amplifying circuit 2b is supplied with a second PWM signal S2 shown in FIG. 3.

Typically, each of the first and the second comparison circuits is provided by an individual comparing unit such as a packaged comparator.

Figure 4:
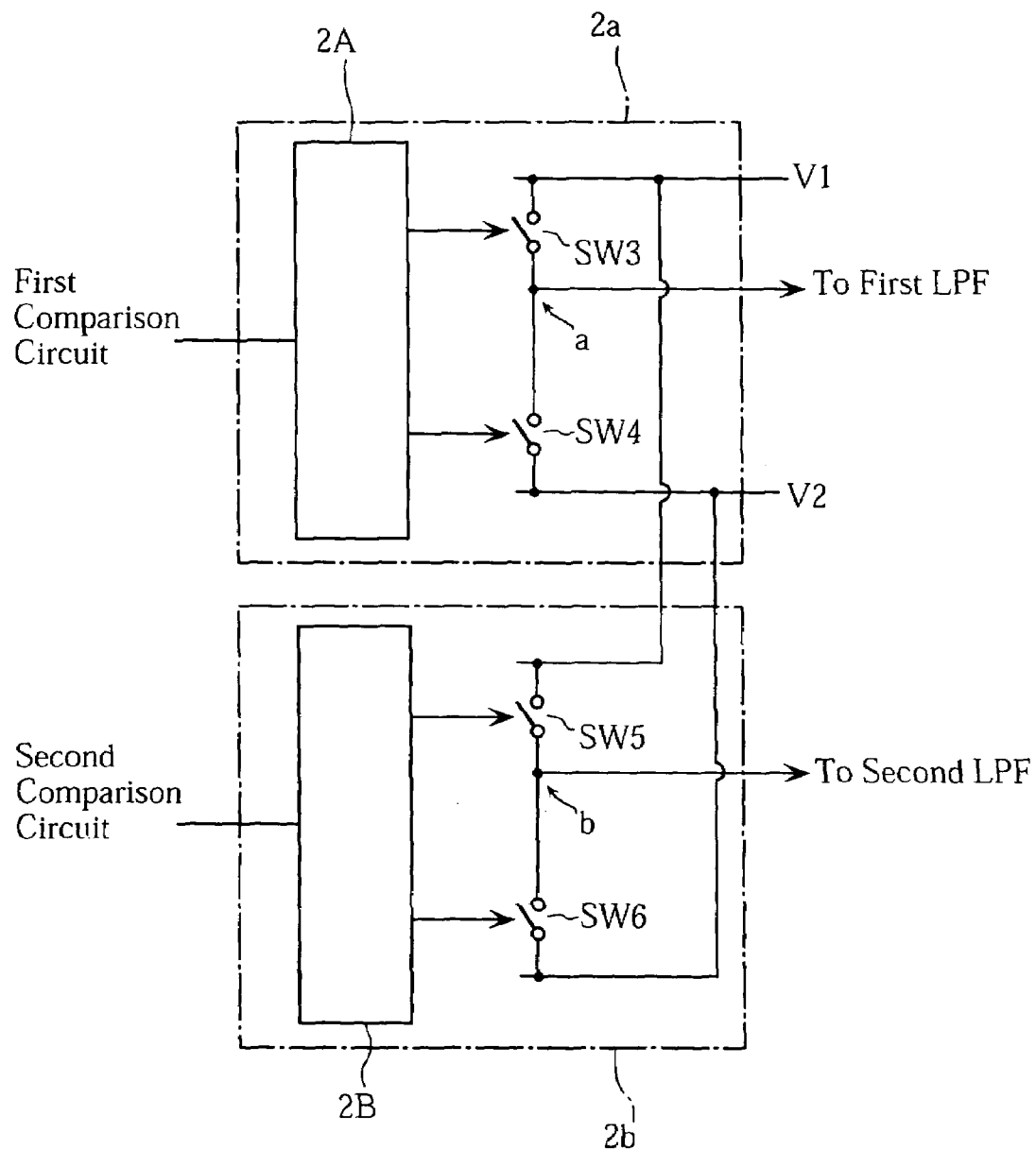
FIG. 4 shows an example of a power amplifying circuit in FIG. 1.

FIG. 4 shows some details of the power amplifying circuit 2. The power amplifying circuit 2 controls voltages to be supplied to the loads L, in accordance with the outputs (PWM signals) from the first and the second comparison circuits 12, 13. The power amplifying circuit 2 includes the first power amplifying circuit 2a and the second power amplifying circuit 2b, as well as four bridge-connected switches SW3 through SW6.

More specifically, the first power amplifying circuit 2a includes a first switch driver 2A connected to the first comparison circuit 12 and two of the switches SW3, SW4 which are turned ON and OFF by the first switch driver 2A. Likewise, the second power amplifying circuit 2b includes a second switch driver 2B connected to the second comparison circuit 13 and two of the switches SW5, SW6 which are turned ON and OFF by the second switch driver 2B.

Each of the switches SW3, SW5 has a first end connected to a positive power source V1. The third switch SW3 has a second end connected to an end of the fourth switch SW4. The fifth switch SW5 has a second end connected to an end of the sixth switch SW6. Each of the switches SW4, SW6 has a second end connected to a negative power source V2. It should be noted here that both of the positive power source V1 and the negative power source V2 may be provided by positive power sources, as long as their voltage relationship is V1>V2.

The first switch driver 2A operates on the output from the first comparison circuit 12 and outputs mutually inversed ON-OFF signals respectively to the switches SW3, SW4. Specifically, the first switch driver 2A turns ON the third switch SW3 and turns OFF the fourth switch SW4 when the output from the first comparison circuit 12 is HIGH whereas it turns OFF the third switch SW3 and turns ON the fourth switch SW4 when the output from the first comparison circuit 12 is LOW.

Likewise, the second switch driver 2B operates on the output from the second comparison circuit 13 and outputs mutually inversed ON-OFF signals respectively to the switches SW5, SW6. Specifically, the second switch driver 2B turns ON the fifth switch SW5 and turns OFF the sixth switch SW6 when the output from the second comparison circuit 13 is HIGH. When the output from the second comparison circuit 13 is LOW, on the other hand, the driver 2B turns OFF the fifth switch SW5 and turns ON the sixth switch SW6.

Including an appropriate combination of coils and capacitors for example, the first low pass filter LP1 and the second low pass filter LP2 are designed to remove high frequency components from input signals. The first low pass filter LP1 has two ends, one of which is connected to between the second end of the third switch SW3 of the power amplifying circuit 2a and the first end of the fourth power switch SW4, whereas the other of the ends is connected to the load L. Likewise, the second low pass filter LP2 has two ends, one of which is connected to between the second end of the fifth switch SW5 of the power amplifying circuit 2b and the first end of the sixth switch SW6, whereas the other of the ends is connected to the other load L.

The comparison signal generation circuit 11 generates the first sawtooth wave and the second sawtooth wave. Specifically, when the first switch SW1 is turned OFF, the first capacitor C1 in the first sawtooth wave generation circuit 15 is charged with a current based on the value of the power source voltage Vcc supplied from the first transistor 22. When the pulse signal from the pulse generation circuit 14 turns ON the first switch SW1 momentarily, the first capacitor C1 discharges. Then, as the first switch SW1 is turned OFF again, the first capacitor C1 is charged again, and so the generation of the first sawtooth wave continues.

Likewise, when the second switch SW2 is turned OFF, the second capacitor C2 in the second sawtooth wave generation circuit 16 is charged with a current based on the value of the power source voltage −Vcc supplied from the second transistor 25. When the pulse signal from the pulse generation circuit 14 turns ON the second switch SW2 momentarily, the second capacitor C2 discharges. Then, as the second switch SW2 is turned OFF again, the second capacitor C2 is charged again, and so the generation of the second sawtooth wave continues.

The first sawtooth wave is inputted to the reference terminal "ref" of the first comparison circuit 12 for comparison with the audio signal inputted to the input terminal "in" of the first comparison circuit 12. The first comparison circuit 12 outputs a first PWM signal S1 in which signal level is inversed in accordance with the level of the audio signal with respect to the first sawtooth wave. Specifically, The first PWM signal S1 is a signal which assumes HIGH level when the audio signal is greater than the first sawtooth wave, and LOW level when the audio signal is smaller than the first sawtooth wave.

When the audio signal has a positive value, the audio signal is always greater than the second sawtooth wave, and thus the second comparison circuit 13 outputs the LOW level signal (that is, no second PWM signal S2 is outputted.) Meanwhile, the first comparison circuit 12 outputs the first PWM signal S1 which becomes HIGH when the audio signal is greater than the first sawtooth wave and becomes LOW when the audio signal is smaller than the first sawtooth wave. Based on this first PWM signal S1 outputted from the first comparison circuit 12, the first switch driver 2A of the first power amplifying circuit 2a is operated, thereby turning ON and OFF the switches SW3, SW4 of the first power amplifying circuit 2a. For example, when the first PWM signal S1 assumes HIGH level, the switch SW3 is turned ON and the switch SW4 is turned OFF. When the first PWM signal S1 assumes LOW level, the switch SW3 is turned OFF and the switch SW4 is turned ON.

The second sawtooth wave is inputted to the input terminal "in" of the second comparison circuit 13 for comparison with the audio signal inputted to the reference terminal "ref" of the second comparison circuit 13. The second comparison circuit 13 outputs a second PWM signal S2 in which signal level is inversed in accordance with the level of the audio signal with respect to the second sawtooth wave. Specifically, the second PWM signal S2 is a signal which assumes HIGH level when the audio signal is smaller than the second sawtooth wave, and LOW level when the audio signal is greater than the second sawtooth wave.

When the audio signal has a negative value, the first comparison circuit 12 outputs the LOW level signal (that is, no first PWM signal S1 is outputted) since the audio signal is always smaller than the first sawtooth wave. Meanwhile, the second comparison circuit 13 outputs the second PWM signal S2 which becomes HIGH when the audio signal is smaller than the second sawtooth wave and becomes LOW when the audio signal is greater than the second sawtooth wave. Based on this second PWM signal S2 outputted from the second comparison circuit 13, the second switch driver 2B of the second power amplifying circuit 2b is operated, thereby turning ON and OFF the switches SW5, SW6 of the second power amplifying circuit 2b. For example, when the second PWM signal S2 assumes HIGH level, the switch SW5 is turned ON and the switch SW6 is turned OFF. When the second PWM signal S2 assumes LOW level, the switch SW5 is turned OFF and the switch SW6 is turned ON.

In the power amplifying circuit 2, the switching operation of the switches SW3 to SW6 results in the output voltage difference between the first power amplifying circuit 2a and the second power amplifying circuit 2b, as represented by "a−b Voltage" in FIG. 3, which implies the voltage between the point "a" and the point "b" (shown in FIG. 1). Specifically, when the audio signal has a positive value, the second PWM signal S2 assumes LOW level and therefore the switch SW5 is always OFF and the switch SW6 is always ON. Since the first PWM signal S1 outputted from the first comparison circuit 12 controls the mutually reversed ON-OFF action of the switches SW3, SW4, there is applied a voltage between "a" and "b", which has an amplitude V1–V2 [V] and changes at the same pulse width timing as of the first PWM signal S1. It should be noted here that, in FIG. 3, the a–b voltage is represented as positive when the current flows from the point "a" to the point "b", whereas the voltage is represented as negative when the current flows from the point "b" to the point "a".

On the other hand, when the audio signal has a negative value, the first PWM signal S1 assumes LOW level, and therefore the switch SW3 is always OFF while the switch SW4 is always ON. Since the second PWM signal S2 outputted from the second comparison circuit 13 controls the mutually reversed ON-OFF action of the switches SW5, SW6, there is applied a a–b voltage, which has an amplitude V2–V1 [V] and changes at the same pulse width timing as of the PWM signal S2.

In the first sawtooth wave generation circuit 15 of the comparison signal generation circuit 11, when there is an input of a volume control signal from outside, the amplitude of the first sawtooth wave is varied. Specifically, the input of the volume control signal varies the internal resistance of the first variable resistor 21, which varies the value of charging current supplied from the first transistor 22 to the first capacitor C1. This varies the charging voltage between the ends of the first capacitor C1, and as represented by the waveform A' in FIG. 3, the first sawtooth wave is varied in its amplitude. Note that FIG. 3 shows a case in which the amplitude of the first sawtooth wave is reduced (i.e. a case when the audio signal is increased.)

Likewise, when there is an input of a volume control signal from outside, the amplitude of the second sawtooth wave is varied in the second sawtooth wave generation circuit 16 of the comparison signal generation circuit 11. Specifically, the input of the volume control signal varies the internal resistance of the second variable resistor 24, which varies the value of charging current supplied from the second transistor 25 to the second capacitor C2. This varies the charging voltage between the ends of the second capacitor C2, and as represented by the waveform B' in FIG. 3, the second sawtooth wave is varied in its amplitude. Note that FIG. 3 shows a case in which the amplitude of the second sawtooth wave is reduced.

The first sawtooth wave whose amplitude has been varied is then inputted to the first comparison circuit 12 for comparison with the audio signal. As a result, the first comparison circuit 12 outputs, as shown in FIG. 3, a first PWM signal S1' which has a slightly longer width in its HIGH level than in the first PWM signal S1 which is the signal before the amplitude change.

Likewise, the second sawtooth wave whose amplitude has been varied is then inputted to the second comparison circuit 13 for comparison with the audio signal. As a result, the second comparison circuit 13 outputs, as shown in FIG. 3, the second PWM signal S2' which has a slightly longer width in its HIGH level than in the second sawtooth wave S2 which is the signal before the amplitude change.

In the power amplifying circuit 2, individual operation of the switches SW3 through SW6 based on the first PWM signal S1' and the second PWM signal S2' results in output voltage differences between the first power amplifying circuit 2a and the second power amplifying circuit 2b as represented by "a–b Voltage After Amplitude Variation" in FIG. 3. Specifically, when the audio signal has a positive value, there is applied a voltage between "a–b", which has an amplitude V1–V2 [V] and changes at the same pulse width timing as of the first PWM signal S1'. On the other hand, when the audio signal has a negative value, there is applied a voltage between "b–a", which has an amplitude V2–V1 [V] and changes at the same pulse width timing as of the second PWM signal S2'.

According to the above-described arrangements, the volume control signal varies the amplitude of the first sawtooth wave and the second sawtooth wave. After the amplitude variation, the first sawtooth wave and the second sawtooth wave are compared with the audio signal and converted to PWM signals in the first comparison circuit 12 and the second comparison circuit 13 respectively, and these PWM signals are supplied to the power amplifying circuit 2. This provides virtually the same amplitude control as the varying of the audio signal amplitude by means of the variable resistor 40 described in Background Art.

Figure 5:
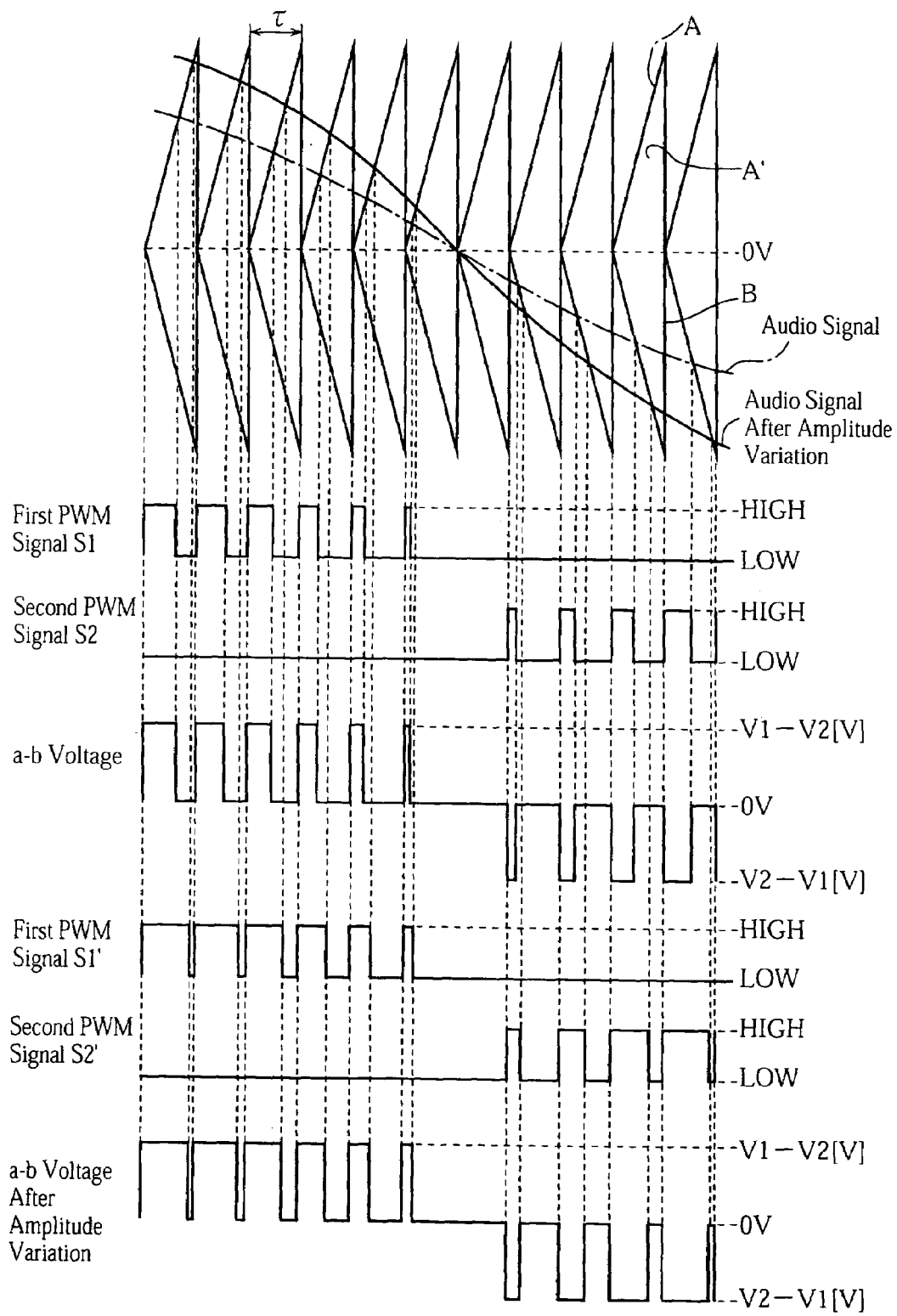
FIG. 5 is a waveform chart of outputs from the power amplifying circuit when an audio signal is varied.

FIG. 5 shows waveforms of the first and the second PWM signals S1', S2', a voltage waveform between "a–b" and other forms when the audio signal amplitude is varied, while the amplitude of the first sawtooth wave or the second sawtooth wave remains unchanged. The waveforms are similar to the corresponding waveforms given in FIG. 3. In other words, the process by the present embodiment, in which the PWM signals are generated to vary the amplitude of the first sawtooth wave and the second sawtooth wave, can produce a result equivalent to the result of the case where the amplitude of the audio signal is varied.

Further, the comparison signal generation circuit 11 varies the amplitude of the first sawtooth wave and the second sawtooth wave, not the amplitude of the input audio signal. Therefore, the input impedance as viewed toward the audio signal source AU ("signal source impedance") does not change. Accordingly, it is possible to overcome the conventional problem, that is, the undesirable change of the signal source impedance due to the variation of the audio signal amplitude.

Figure 6:
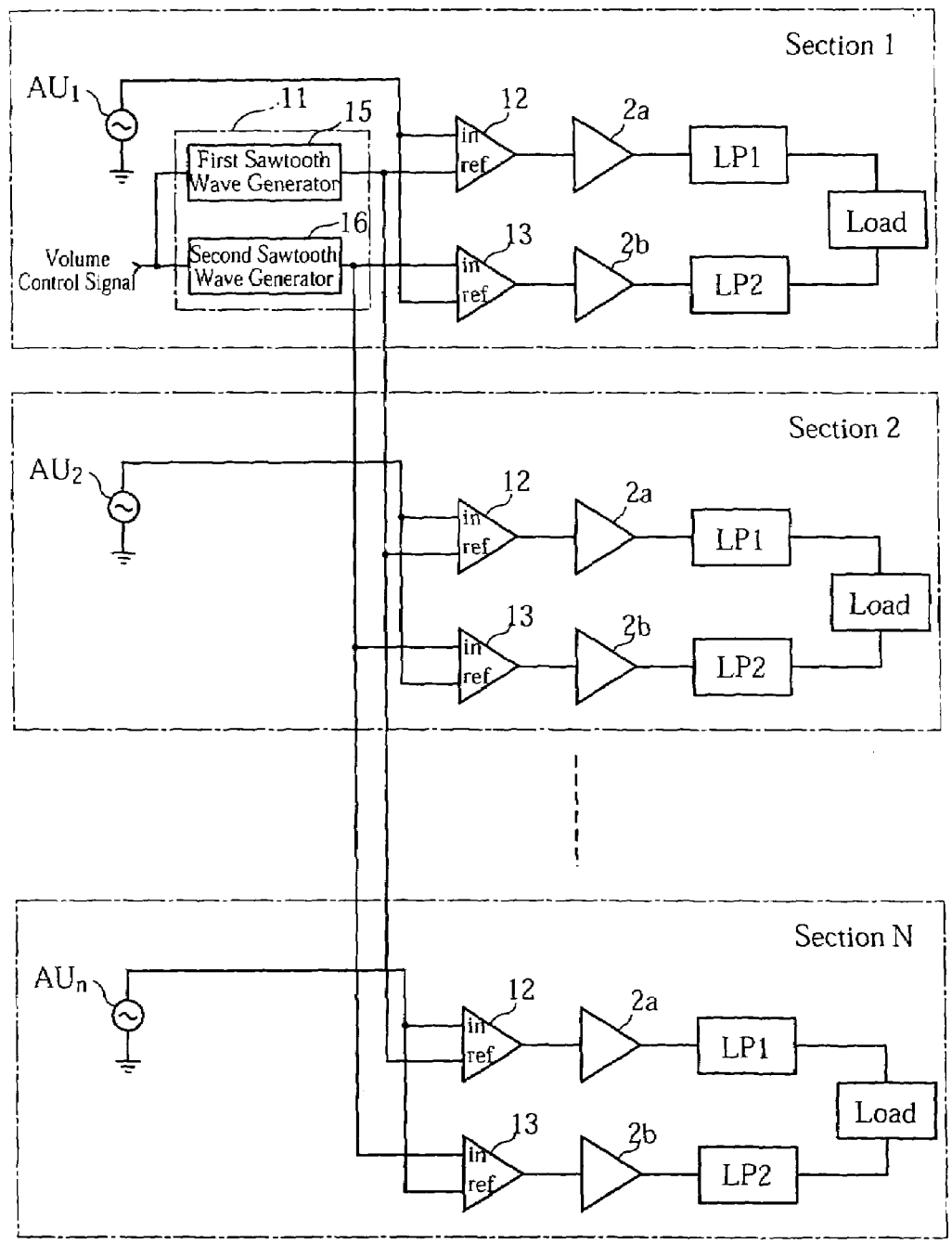
FIG. 6 is a block diagram illustrating a modification of the switching amplifier according to the first embodiment.

Reference is now made to FIG. 6 which is a block diagram showing a modification of the above-described switching amplifier of the first embodiment. The illustrated switching amplifier is designed for performing a so-called "multi-channel sound signal processing."

The multi-channel switching amplifier comprises a plurality of Sections (or Channels) 1, 2, . . . , N. As understood by the comparison between FIG. 6 and FIG. 1, Section 1 shown in FIG. 6 is equivalent to the switching amplifier shown in FIG. 1. Specifically, Section 1 includes an audio signal source $AU_1$, a comparison signal generation circuit 11 (having first and second sawtooth wave generators 15, 16), a pair of comparison circuits 12–13, a pair of power amplifying circuits 2a–2b, a pair of low pass filters LP1–LP2, and a load such as a loudspeaker. The comparison signal generation circuit 11 receives a volume control signal for adjusting the voltage to be applied across the load. The function of Section 1 is the same as that of the switching amplifier of FIG. 1. Though the details of the function are not repeated here, the main features of Section 1 may be summarized as follows.

In operation, the first sawtooth wave generator 15 generates a first comparison signal having a prescribed period, and the second sawtooth wave generator 16 generates a second comparison signal having the same period as the first comparison signal, where the second comparison signal is in inverted relation to the first comparison signal. The amplitude of the first comparison signal and the amplitude of the second comparison signal are controlled in accordance with the volume control signal inputted to the comparison signal generation circuit 11. After the amplitude of the first comparison signal is controlled, the first comparison circuit 12 compares the first comparison signal from the generator 15 and the audio input signal from the audio signal source $AU_1$. Likewise, the second comparison circuit 13 compares the second comparison signal from the generator 16 and the audio input signal from the audio signal source $AU_1$, after the amplitude of the second comparison signal is controlled.

Then, the first comparison circuit 12 outputs a signal whose level is inverted in accordance with the relative level of the audio input signal with respect to the first comparison signal. The outputted signal is supplied to the power amplifying circuit 2a. Meanwhile, the second comparison circuit 13 outputs a signal whose level is inverted in accordance with the relative level of the audio input signal with respect to the second comparison signal, the outputted signal being supplied to the power amplifying circuit 2b.

In Section 2 (and in any other Section 3-N as well), the first comparison circuit 12 is connected to the first sawtooth wave generator 15, and the second comparison circuit 13 is connected to the second sawtooth wave generator 16. The first and the second comparison circuits 12, 13 receive an audio input signal from the signal source $AU_2$ (a source additional to the first source $AU_1$).

The first comparison circuit 12 compares the first comparison signal from the generator 15 and the audio input signal from the source $AU_2$. Likewise, the second comparison circuit 13 compares the second comparison signal from the generator 16 and the audio input signal from the source $AU_2$.

Then, the first comparison circuit 12 outputs a signal whose level is inverted in accordance with the relative level of the additional audio input signal (i.e., the signal from the source $AU_2$) with respect to the first comparison signal. The outputted signal is then supplied to the power amplifying circuit 2a. Similarly, the second comparison circuit 13 outputs a signal whose level is inverted in accordance with the relative level of the additional input signal with respect to the second comparison signal, the outputted signal being supplied to the power amplifying circuit 2b.

With the above-described arrangement, the volume control for Sections 1 through N does not need to be performed individually, since all the audio signals from the signal sources $AU_1$-$AUn$ can be controlled collectively based on a single volume control signal inputted to the shared comparison signal generation circuit 11.

Figure 7:
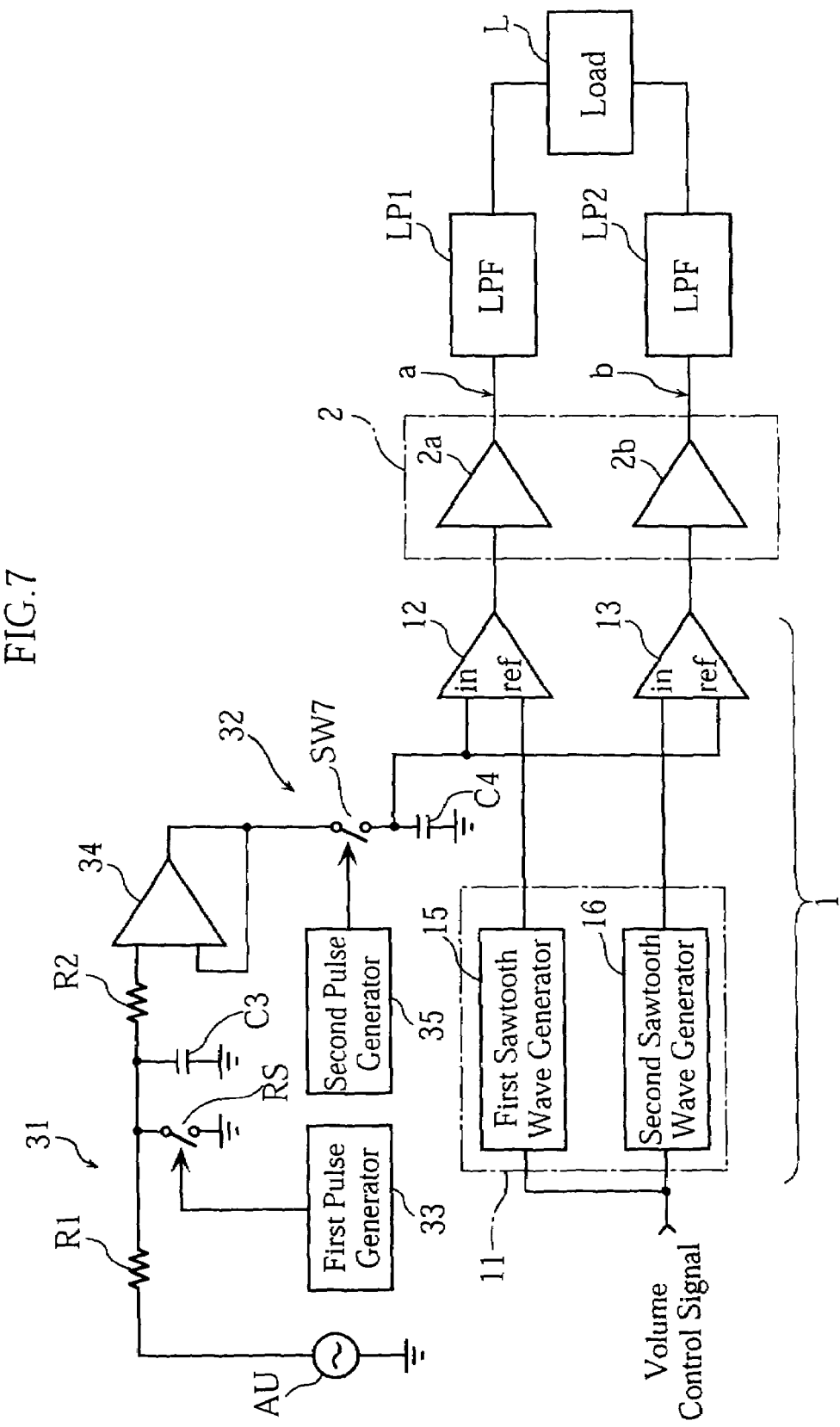
FIG. 7 is a block diagram of a switching amplifier including a PWM circuit according to a second embodiment of the present invention.

FIG. 7 is a block diagram of a switching amplifier including a PWM circuit 1 according to a second embodiment of the present invention. The switching amplifier of the second embodiment is similar to the switching amplifier of the above-described first embodiment, except that the PWM circuit 1 of the second embodiment includes some additional components or elements unused in the first embodiment. Specifically, the PWM circuit 1 of the second embodiment additionally includes an integrating circuit 31 and a sample hold circuit 32 for removing impulse noise from audio signals.

As shown in FIG. 7, the integrating circuit 31 includes a resistor R1, a capacitor C3, a first pulse generating circuit 33, and a reset switch RS. The resistor R1 has a first end connected to the audio signal source AU, and a second end connected to an end of the capacitor C3. The other end of the capacitor C3 is grounded. The integral of the audio signal is performed by the resistor R1 and the capacitor C3.

The second end of the resistor R1 is connected to an end of the reset switch RS, the other end of which is grounded. The reset switch RS is turned ON and OFF based on a pulse signal outputted from a first pulse generation circuit 33. Further, the second end of the resistor R1 is connected to an end of an input resistor R2, the other end of which is connected to one of the input terminals of a buffer amplifier 34. The buffer amplifier 34 has an output terminal connected to the other of its input terminals as well as connected to the sample hold circuit 32.

The sample hold circuit 32 includes a sampling switch SW7, a second pulse generating circuit 35 and a capacitor C4. The sampling switch SW7 has an end connected to the output terminal of the buffer amplifier 34. The other end of the sampling switch SW7 is connected to an end of the capacitor C4 (the other end of which is grounded), to the input terminal of the first comparison circuit 12, and to the reference terminal "ref" of the second comparison circuit 13. The sampling switch SW7 is turned ON and OFF based on a pulse signal outputted from the second pulse generation circuit 35.

Figure 9:
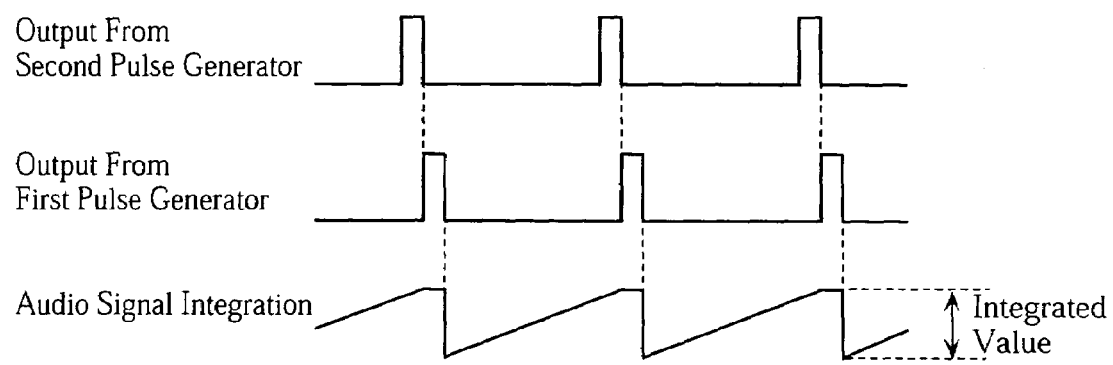
FIG. 9 is a waveform chart of outputs from the power amplifying circuit in FIG. 5.

In the above arrangements, as shown in FIG. 9, the pulse signal outputted from the second pulse generation circuit 35 turns ON the sampling switch SW7, allowing the charged voltage integrated by the resistor R1 and the capacitor C3 to be sampled. The pulse signal from the first pulse generation circuit 33 turns ON as the pulse signal from the second pulse generation circuit 35 drops. The ON signal from the first pulse generation circuit 33 turns ON the reset switch RS, to cause the capacitor C3 to discharge the accumulated voltage.

Figure 8:
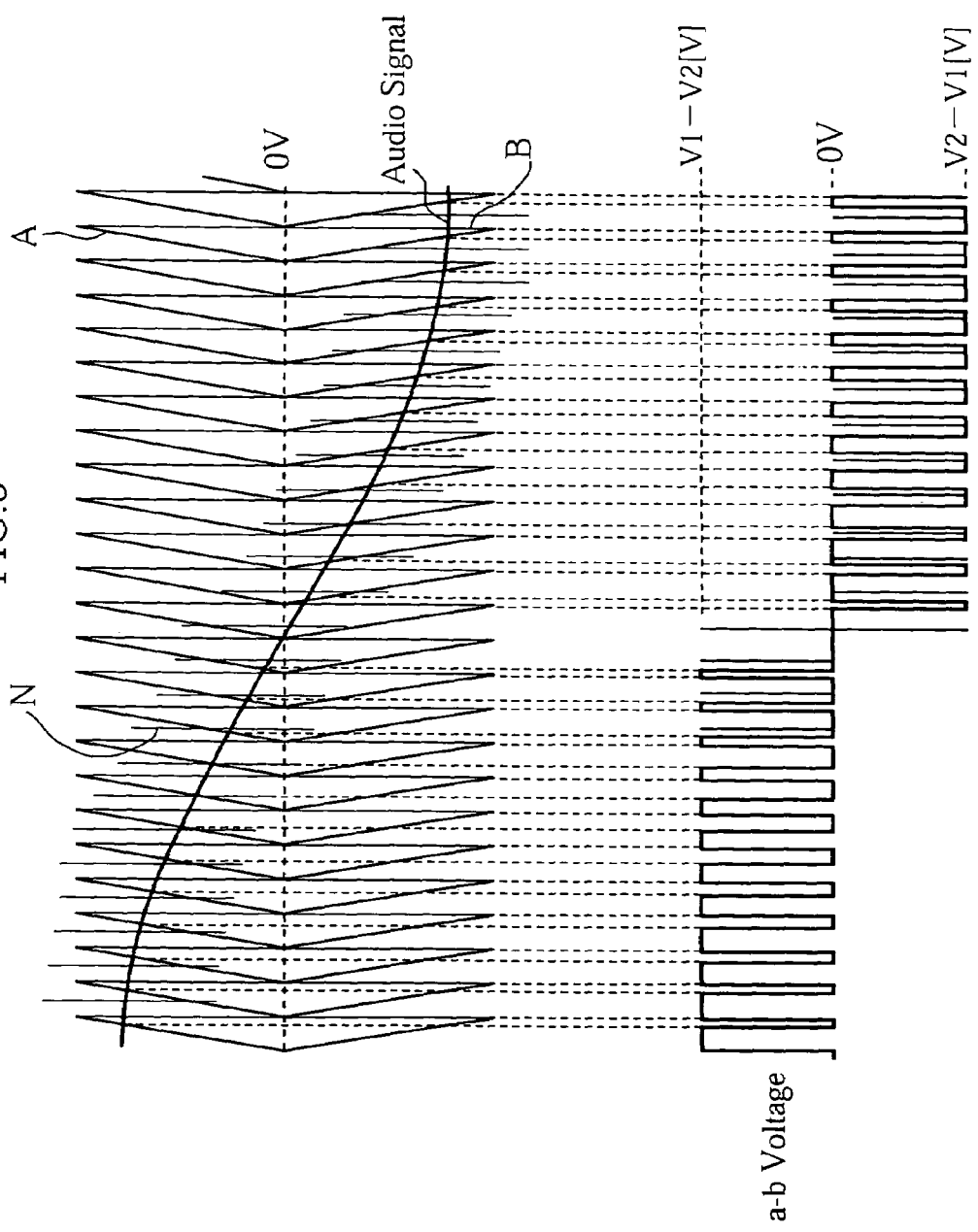
FIG. 8 is a waveform chart of an output from the power amplifying circuit when there is noise in the PWM circuit in FIG. 1.
Figure 10:
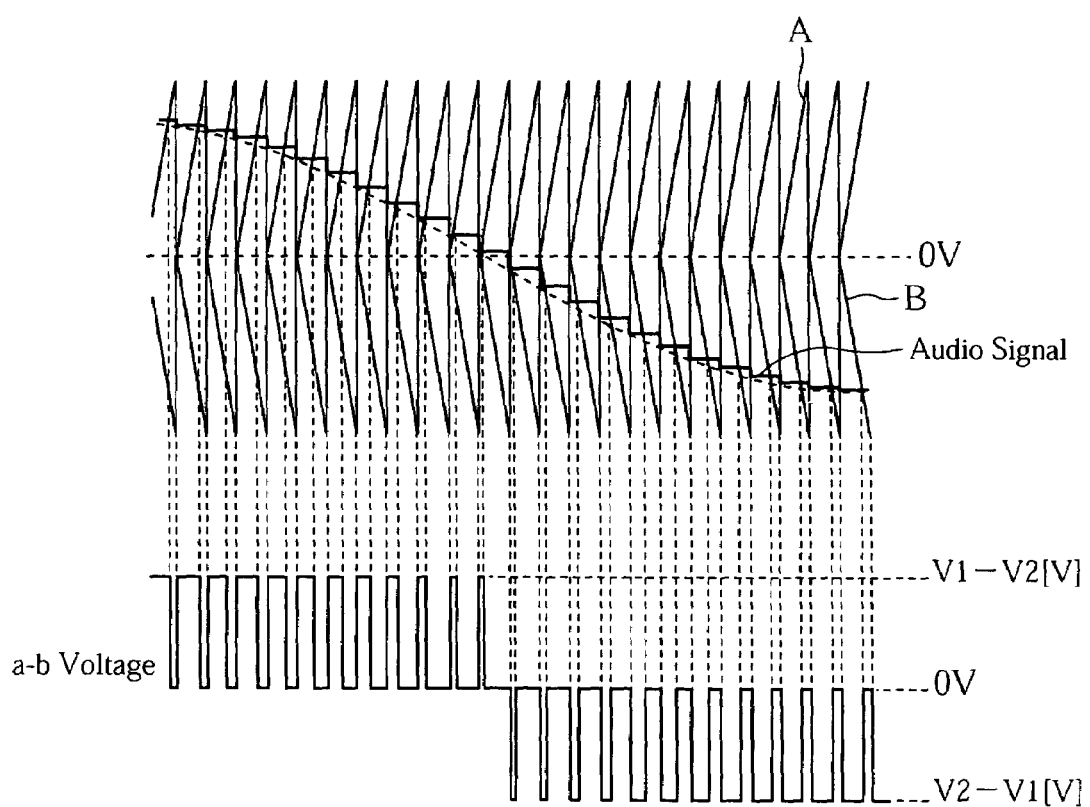
FIG. 10 illustrates the operation of an integrating circuit and a sample hold circuit.

Based on the operation of the integrating circuit 31 and the sample hold circuit 32 as described above, the audio signal from the audio signal source AU undergoes level conversion characterized by stepped changes as shown in FIG. 10, which makes it possible to remove impulse noise (see the reference character N in FIG. 8) in the audio signal. This is advantageous for obtaining noiseless signals. If there remain impulse noise in the audio signal, the voltage waveform between "a–b" is deformed by the noise (See "a–b Voltage" in FIG. 8), and it becomes impossible to output a good PWM signal to the power amplifying circuit 2.

Figure 11:
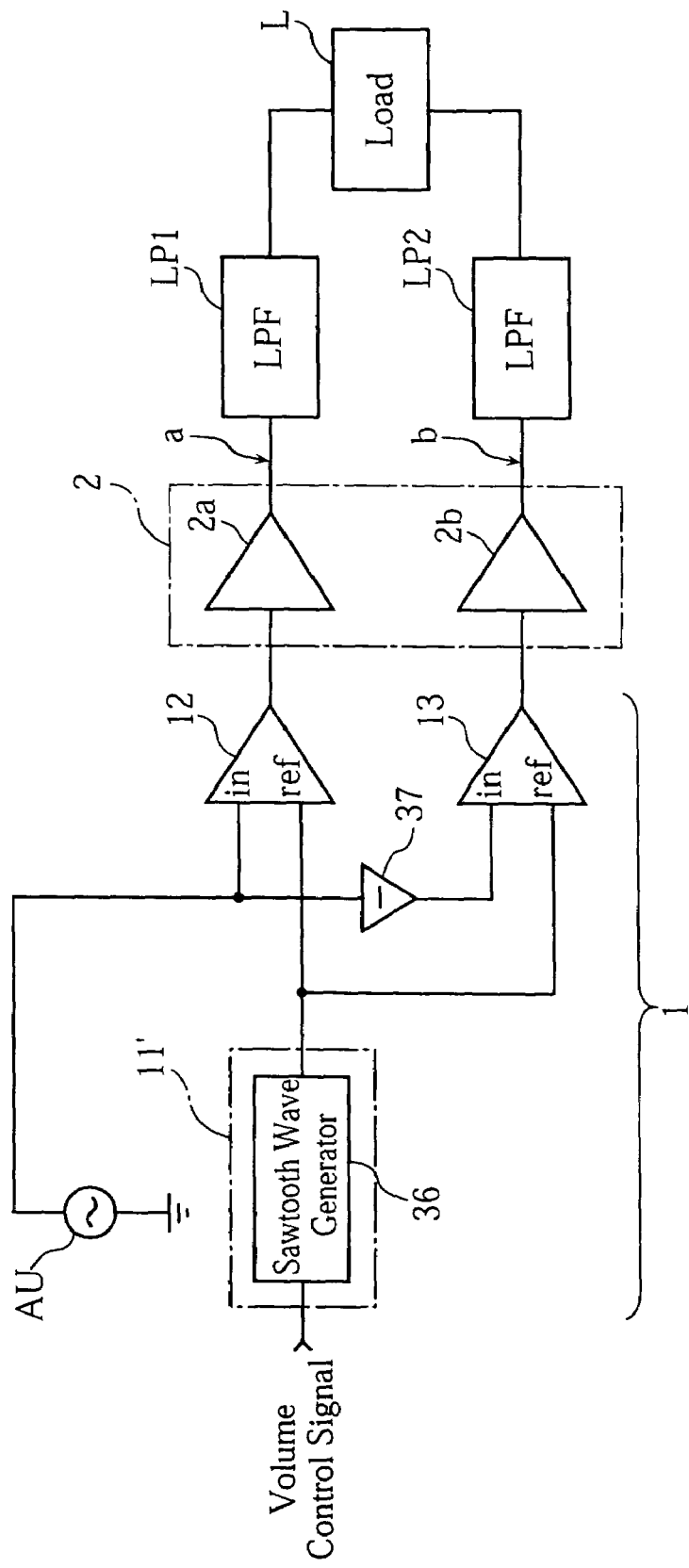
FIG. 11 is a block diagram of a switching amplifier including a PWM circuit according to a third embodiment of the present invention.
Figure 12:
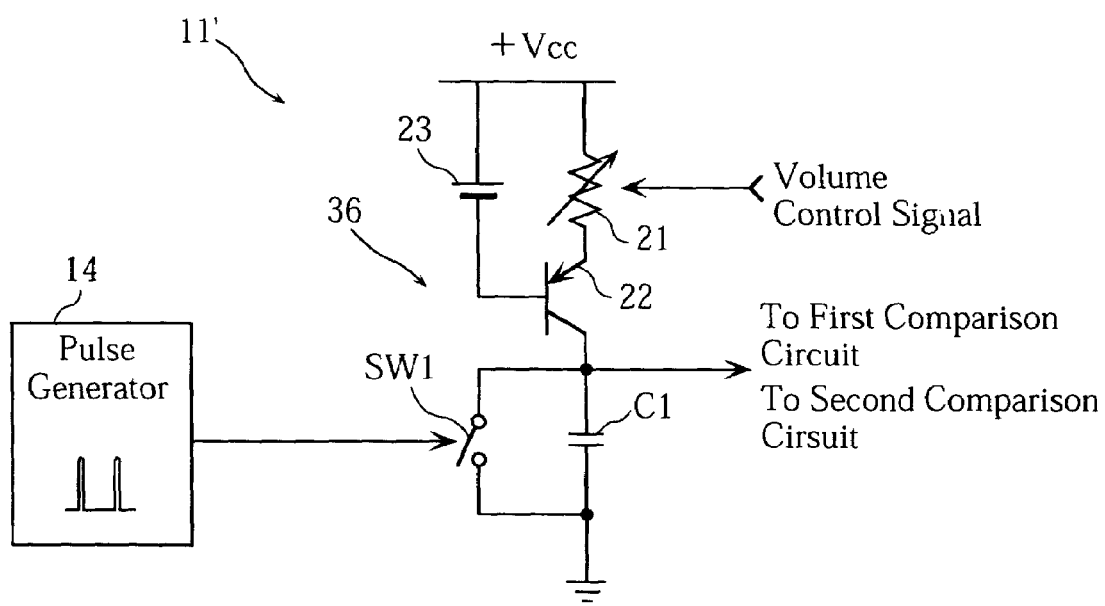
FIG. 12 is a circuit diagram of a comparative signal generating circuit in FIG. 10.

FIG. 11 is a block diagram of a switching amplifier including a PWM circuit 1 according to a third embodiment of the present invention. FIG. 12 is a circuit diagram of a comparison signal generating circuit 11'.

The PWM circuit 1 of the third embodiment differs from the counterpart of the first embodiment generally in the following two respects. First, the circuit 1 of the third embodiment includes an inversion circuit 37 for inverting the audio signal. Second, the comparison signal generation circuit 11' of the third embodiment includes only one sawtooth wave generating circuit 36.

The audio signal source AU is connected to the input terminal "in" of the first comparison circuit 12 and to an input terminal of an inversion circuit 37. The inversion circuit 37 has an output terminal connected to the input terminal "in" of the second comparison circuit 13. Further, the sawtooth wave generation circuit 36 is connected to the reference terminal "ref" of the first comparison circuit 12 and that of the second comparison circuit 13.

According to the above arrangement, the first comparison circuit 12 has its input terminal "in" supplied with the audio signal, its reference terminal "ref" supplied with the sawtooth wave from the inversion circuit 37, and these two inputs are compared with each other. Then, in the second comparison circuit 13, the audio signal (which has been inverted by the inversion circuit 37) is supplied as one input whereas the other input supplied to the reference terminal "ref" is the same sawtooth wave as supplied to the first comparison circuit 12, and comparison is made between these two inputs.

Figure 13:
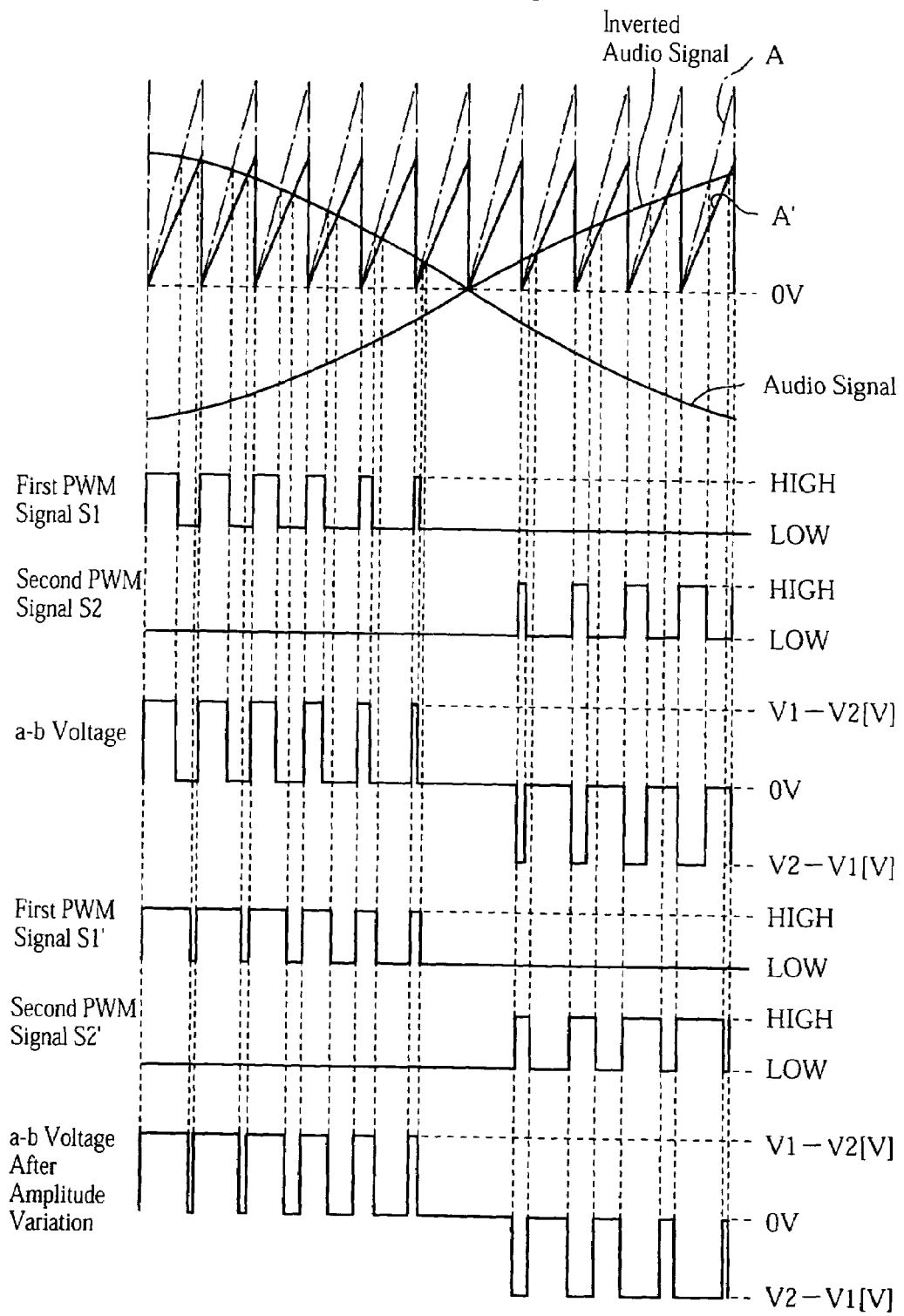
FIG. 13 is a waveform chart of outputs from a power amplifying circuit in FIG. 10.

The output voltage differences between the first power amplifying circuit 2a and the second power amplifying circuit 2b are represented by "a–b Voltage" in FIG. 13. Specifically, the first comparison circuit 12 outputs a first PWM signal S1 which becomes HIGH level when the audio signal has a positive value and if the audio signal is greater than the sawtooth wave, and which becomes LOW level if the audio signal is smaller than the audio signal. Since the first PWM signal S1 outputted from the first comparison circuit 12 controls the ON-OFF action of the switches SW3, SW4 of the first power amplifying circuit 2a when the audio signal has a positive value, a voltage is applied between "a–b", which has an amplitude V1–V2 [V] and changes at the same pulse width timing as of the first PWM signal S1.

On the other hand, when the audio signal has a positive value after the inversion by the inversion circuit 37, the second comparison circuit 13 outputs a second PWM signal S2 which becomes HIGH level if the inverted audio signal is greater than the sawtooth wave, and which becomes LOW level if the inverted audio signal is smaller than the sawtooth wave. Since the second PWM signal S2 outputted from the second comparison circuit 13 controls the ON-OFF action of the switches SW5, SW6 of the second power amplifying circuit 2b when the inverted audio signal has a positive value, a voltage is applied between "b–a", which has an amplitude V2–V1 [V] and changes at the same pulse width timing as of the second PWM signal S2.

In the sawtooth wave generation circuit 36 of the comparison signal generation circuit 11', when there is an input of a volume control signal from outside, the amplitude of the sawtooth wave is varied. Specifically, the input of the volume control signal varies the internal resistance of the first variable resistor 21, which varies the value of charging current supplied from the first transistor 22 to the first capacitor C1. This varies the amplitude of the sawtooth wave as represented by a waveform A' in FIG. 13.

The sawtooth wave whose amplitude has been varied is then inputted to the first comparison circuit 12 for comparison with the audio signal. Thus, the first comparison circuit 12 outputs a first PWM signal S1' which has a slightly longer width in its HIGH level than in the first PWM signal S1 which is the signal before the amplitude change.

Likewise, the sawtooth wave whose amplitude has been varied is then inputted to the second comparison circuit 13 for comparison with the audio signal inverted by the inversion circuit 37 (See FIG. 13). Thus, the second comparison circuit 13 outputs a second PWM signal S2' which has a slightly longer width in its HIGH level than in the second sawtooth wave S2 which is the signal before the amplitude change.

In the power amplifying circuit 2, individual operation of the switches SW3 through SW6 based on the first PWM signal S1' and the second PWM signal S2' results in output voltage differences between the first power amplifying circuit 2a and the second power amplifying circuit 2b as represented by "a–b Voltage After Amplitude Variation" in FIG. 13. Specifically, when the audio signal has a positive value, a voltage is applied between "a–b", which has an amplitude V1–V2 [V] and changes at the same pulse width timing as of the first PWM signal S1'. On the other hand, when the inverted audio signal has a positive value, a voltage is applied between "b–a", which has an amplitude V2–V1 [V] and changes at the same pulse width timing as of the second PWM signal S2'.

According to the above constitution, the inversion circuit 37 inverts the audio signal, which is then compared with the sawtooth wave in the second comparison circuit 13, and the resulting PWM signal is supplied to the power amplifying circuit 2. This ensures the same function as achieved by the first embodiment, while allowing an appropriate PWM signal to be supplied to the power amplifying circuit 2. The present embodiment needs only one sawtooth wave generating circuit 31, which serves to simplify the design of the circuit and reduce the production cost.

It should be appreciated that the PWM circuit 1 according to the third embodiment may include an integrating circuit and a sample hold circuit, as the ones described with respect to the second embodiment at the output terminal of the audio signal source AU.

Figure 14:
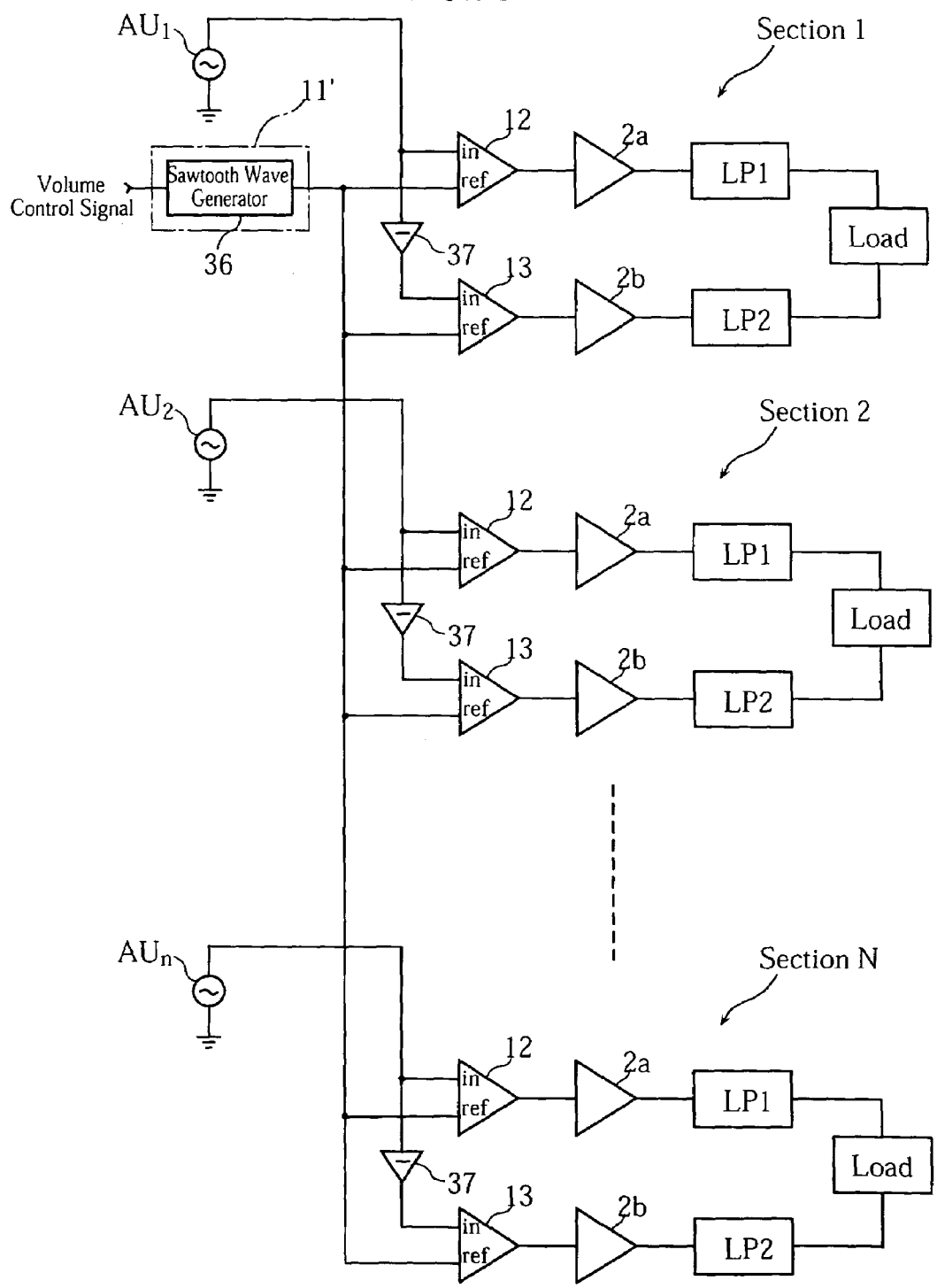
FIG. 14 is a block diagram showing a modification of the switching amplifier according to the third embodiment.

FIG. 14 is a block diagram showing a modification of the switching amplifier shown in FIG. 11. The modified switching amplifier is designed for performing the "multi-channel sound signal processing, as explained above with reference to FIG. 6. As shown in FIG. 14, all Sections 1 through N share a single comparison signal generation circuit 11' into which a volume control signal is inputted. In this case again, all the audio signals from the audio signal sources $AU_1$–$AU_n$ can be adjusted in accordance with a common volume control signal inputted to the comparison signal generation circuit 11'.

In operation, the comparison signal generation circuit 11' generates a comparison signal having a prescribed period. A volume control signal is inputted to the circuit 11'. In accordance with this volume control signal, the amplitude of the comparison signal is controlled, or adjusted. The first comparison circuit 12 of Section 1 compares the comparison signal and the audio input signal from the signal source $AU_1$, after the amplitude of the comparison signal is controlled. Then, the first comparison circuit 12 outputs a signal whose level is inverted in accordance with the relative level of the audio input signal with respect to the comparison signal. The outputted signal is supplied to the power amplifying circuit 2a.

The input signal inverter 37 inverts the audio input signal supplied from the source $AU_1$.

The second comparison circuit 13 compares the comparison signal and the inverted audio input signal. Then, the second comparison circuit 13 outputs a signal whose level is inverted in accordance with the relative level of the audio input signal with respect to the comparison signal. The outputted signal is supplied to the power amplifying circuit 2b.

In Section 2 (and in any other Section 3-N as well), the first and the second comparison circuits 12, 13 are connected to the comparison signal generator 11'. The input signal inverter 37 is connected between the second comparison circuit 13 and the audio signal source $AU_2$.

The first comprising circuit 12 receives an audio input signal from the audio signal source $AU_2$, and compares the comparison signal (from the circuit 11') and the additional audio input signal from the source $AU_2$. Then, the first comparison circuit 12 outputs a signal whose level is inverted in accordance with the relative level of the audio input signal (from the source $AU_2$) with respect to the comparison signal (from the circuit 11'). The outputted signal is supplied to the power amplifying circuit 2a.

The input signal inverter 37 inverts the audio input signal supplied from the source $AU_2$.

The second comparison circuit 13 compares the comparison signal and the inverted audio input signal. Then, the second comparison circuit 13 outputs a signal whose level is inverted in accordance with the relative level of the inverted audio input signal with respect to the comparison signal from the circuit 11'. The outputted signal is supplied to the power amplifying circuit 2b.

With such an arrangement again, all the audio signals from the signal sources $AU_1$–$AU_n$ can be adjusted with a common volume control signal inputted to the shared comparison signal generation circuit 11'.

Figure 15:
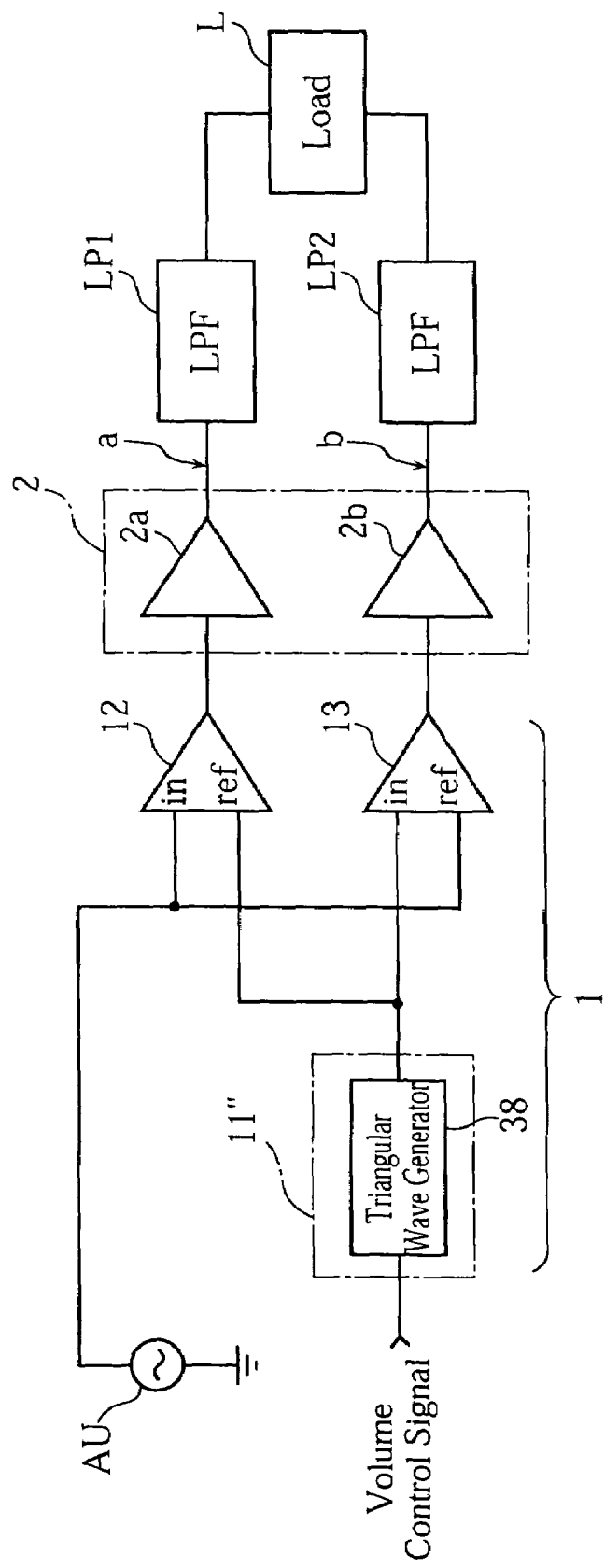
FIG. 15 is a block diagram of a switching amplifier including a PWM circuit according to a fourth embodiment of the present invention.

FIG. 15 is a block diagram of a switching amplifier including a PWM circuit according to a fourth embodiment of the present invention.

The PWM circuit 1 according to the fourth embodiment includes a comparison signal generation circuit 11" in place of the comparison signal generation circuit 11 of the first embodiment. The comparison signal generation circuit 11" of the third embodiment is provided with a single triangular-wave generation circuit 38, while the counterpart of the first embodiment is provided with two triangular-wave generation circuits, i.e., the first sawtooth wave generation circuit 15 and the second sawtooth wave generation circuit 16.

The triangular wave generation circuit 38 generates a triangular wave pattern having a prescribed period and an identical amplitude values in the positive and the negative directions with respect to the 0 volt line. An output from the circuit 38 is supplied to the reference terminal "ref" of the first comparison circuit 12 and the input terminal "in" of the second comparison circuit 13. All the other aspects of construction are the same as in the first embodiment.

According to the above construction, the first comparison circuit 12 has its input terminal "in" supplied with the audio signal, and its reference terminal "ref" supplied with the triangular wave from the triangular wave generation circuit 38, and comparison is made between these two signals. Thus, as shown in FIG. 16, the first comparison circuit 12 outputs a first PWM signal S1 which becomes HIGH level when the audio signal is greater than the triangular wave and becomes LOW level when the audio signal is smaller than the triangular wave.

Likewise, the second comparison circuit 13 has its input terminal "in" supplied with the triangular wave from the triangular wave generation circuit 38, and its reference terminal "ref" supplied with the audio signal, and comparison is made between these two signals. The second comparison circuit 13 outputs a second PWM signal S2 which becomes LOW level when the audio signal is greater than the triangular wave and becomes HIGH level when the audio signal is smaller than the triangular wave.

Figure 16:
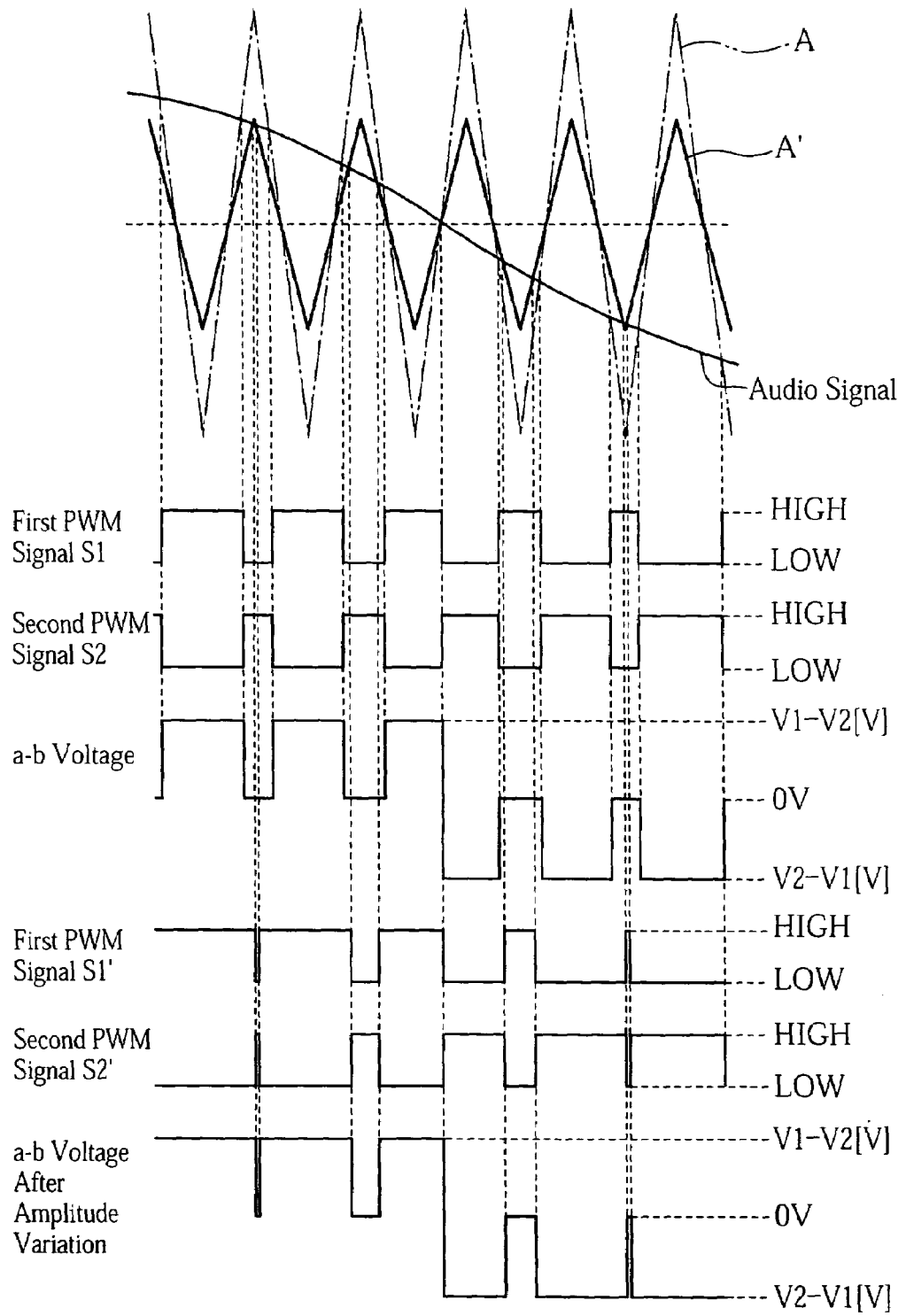
FIG. 16 is a waveform chart of outputs from the power amplifying circuit in FIG. 15.

The output voltage difference between the first power amplifying circuit 2a and the second power amplifying circuit 2b is represented by "a–b Voltage" in FIG. 16. Specifically, when the audio signal has a positive value, a voltage is applied between "a–b", which has an amplitude V1–V2 [V] and changes at the same pulse width timing as of the first PWM signal S1, since the switches SW3, SW4 of the first power amplifying circuit 2a are switched ON and OFF based on the first PWM signal S1 outputted from the first comparison circuit 12.

When the audio signal has a negative value, a voltage is applied between "a–b", which has an amplitude V2–V1 [V] and changes at the same pulse width timing as of the second PWM signal, since the switches SW5, SW6 of the second power amplifying circuit 2b are switched ON and OFF based on the second PWM signal S2 outputted from the second comparison circuit 13.

In the triangular wave generation circuit 38, when there is an input of a volume control signal from outside, the amplitude of the triangular wave A is varied as shown in FIG. 16. A triangular wave A' whose amplitude has been varied is then inputted to the first comparison circuit 12 for comparison with the audio signal. Thus, the first comparison circuit 12 outputs a first PWM signal S1' which has a slightly longer width in its HIGH level duration for positive signal input and a slightly longer width in its LOW level duration for negative signal input, than does the first PWM signal S1 which is the signal before the amplitude change.

The triangular wave whose amplitude has been varied is also inputted to the second comparison circuit 13 for comparison with the audio signal. Thus, the second comparison circuit 13 outputs a second PWM signal S2' which has a slightly longer width in its LOW level duration for positive signal input and a slightly longer width in its HIGH level duration for negative signal input, than does the second PWM signal S2 which is the signal before the amplitude change.

In the power amplifying circuit 2, individual operation of the switches SW3 through SW6 based on the first PWM signal S1' and the second PWM signal S2' results in the output voltage difference between the first power amplifying circuit 2a and the second power amplifying circuit 2b as represented by "a–b Voltage After Amplitude Variation" in FIG. 16. Specifically, when the audio signal has a positive value, a voltage is applied between "a–b", which has an amplitude V1–V2 [V] and changes at the same pulse width timing as of the first PWM signal S1' at the same pulse width. On the other hand, when the audio signal has a negative value, a voltage is applied between "b–a", which has an amplitude V2–V1 [V] and changes at the same pulse width timing as of the second PWM signal S2'.

The fourth embodiment may include the integrating circuit 31 and the sample hold circuit 32 as described with respect to the second embodiment. These two circuits may be disposed next to the audio signal source AU for removing impulse noise from the audio signals. Thereafter, the noiseless signal is supplied to the first and the second comparison circuits 12 and 13.

Figure 17:
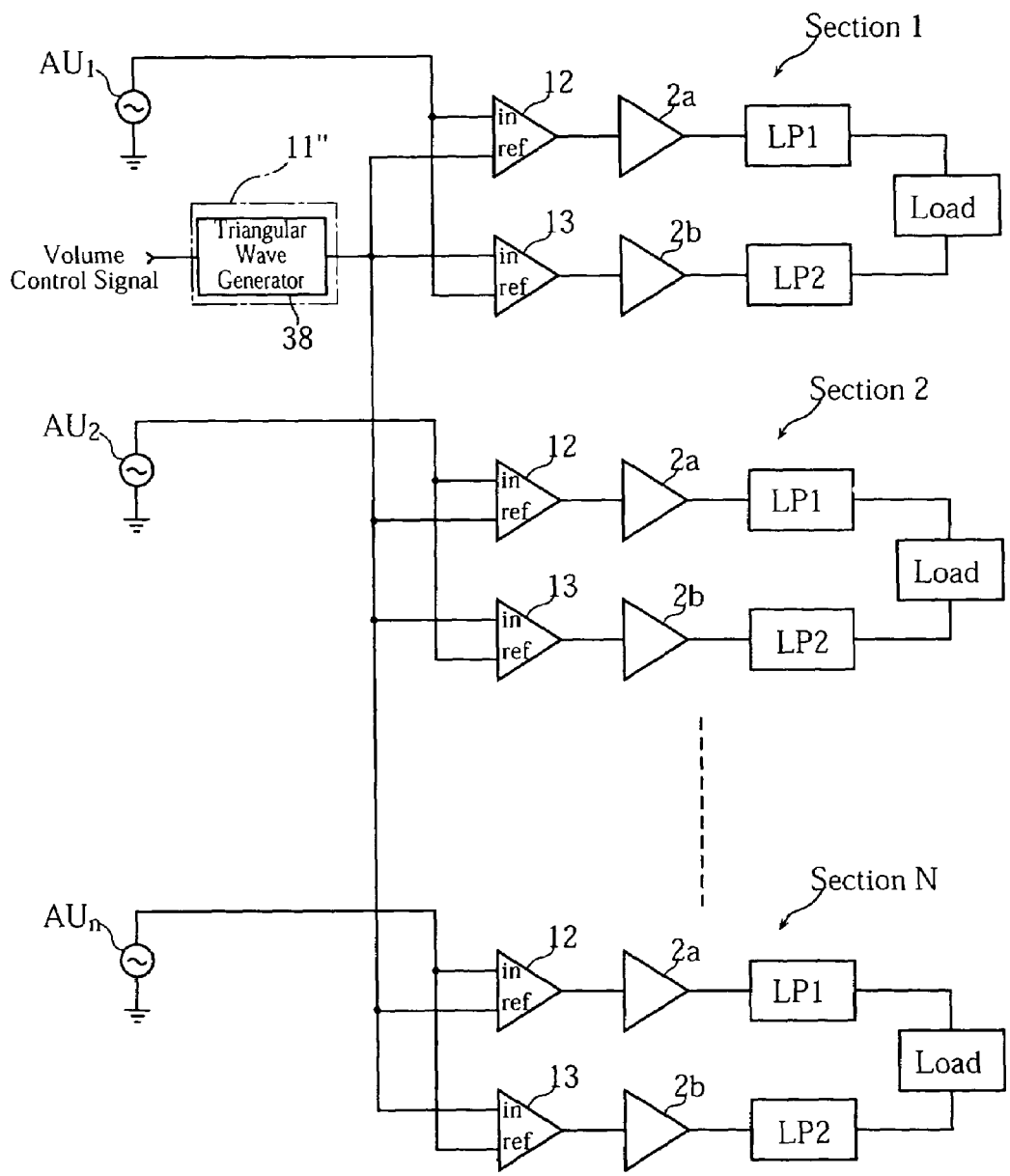
FIG. 17 is a block diagram showing a modification of the switching amplifier according to the fourth embodiment.

FIG. 17 is a block diagram showing a modification of the switching amplifier shown in FIG. 15. The modified switching amplifier is designed for performing the "multi-channel" sound signal processing, as explained above with reference to FIG. 6. As shown in FIG. 17, all Sections 1 through N share a single comparison signal generation circuit 11" into which a volume control signal is inputted.

In operation, the comparison signal generation circuit 11" generates a comparison signal having a prescribed period. The circuit 11" also receives a volume control signal. Based on the volume control signal, the circuit 11" controls the amplitude of the comparison signal, and outputs the controlled comparison signal to the comparison circuits 12, 13. Besides this comparison signal, the comparison circuits 12, 13 receive an audio input signal from the signal source $AU_1$. Then, the comparison circuits 12, 13 compare the comparison signal and the audio input signal for output of a signal whose level is inverted in accordance with the relative level of the audio input signal with respect to the comparison signal. The signals outputted from the comparison circuits 12, 13 are supplied to the power amplifying circuits 2a–2b.

In Section 2 (and in any other Section 3 through N as well), an additional audio input signal (i.e., the signal from the signal source $AU_2$) is inputted to the comparison circuits 12, 13. Besides this signal, the comparison circuits 12, 13 receive the comparison signal generated by the comparison signal generated by and supplied from circuit 11" of Section 1. Then, the comparison circuits 12, 13 compare the comparison signal and the additional audio signal (from the source $AU_2$), to output a signal whose level is inverted in accordance with the relative level of the additional audio signal with respect to the comparison signal from circuit 11". The outputted signals are supplied to the power amplifying circuits 2a, 2b.

With such an arrangement again, all the audio signals from the audio signal sources $AU_1$–$AU_n$ can be adjusted with a single volume control signal, which is inputted to the comparison signal generation circuit 11".

Figure 18:
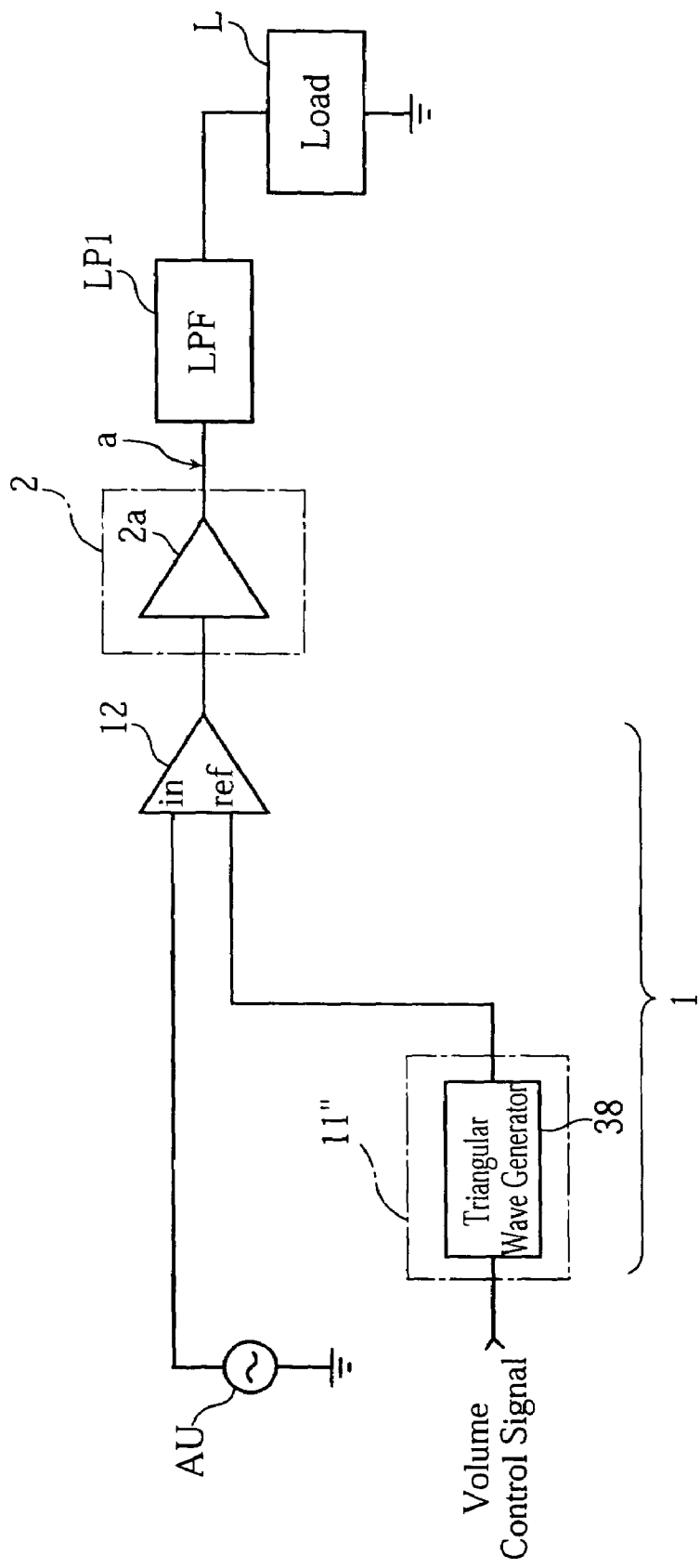
FIG. 18 is a block diagram of a switching amplifier including a PWM circuit according to a fifth embodiment of the present invention.

FIG. 18 is a block diagram of a switching amplifier including a PWM circuit according to a fifth embodiment of the present invention.

Differing from the audio amplifier in the fourth embodiment, the switching amplifier according to the fifth embodiment does not include the second comparison circuit 13, the power amplifying circuit 2b and the second low pass filter LP2. Specifically, the variation of the voltage applied to the load L is performed only by a PWM signal S1 which is obtained through comparison between the triangular wave outputted from the triangular wave generation circuit 38 and the audio signal. All the other aspects of construction are generally the same as those of the first embodiment.

Figure 19:
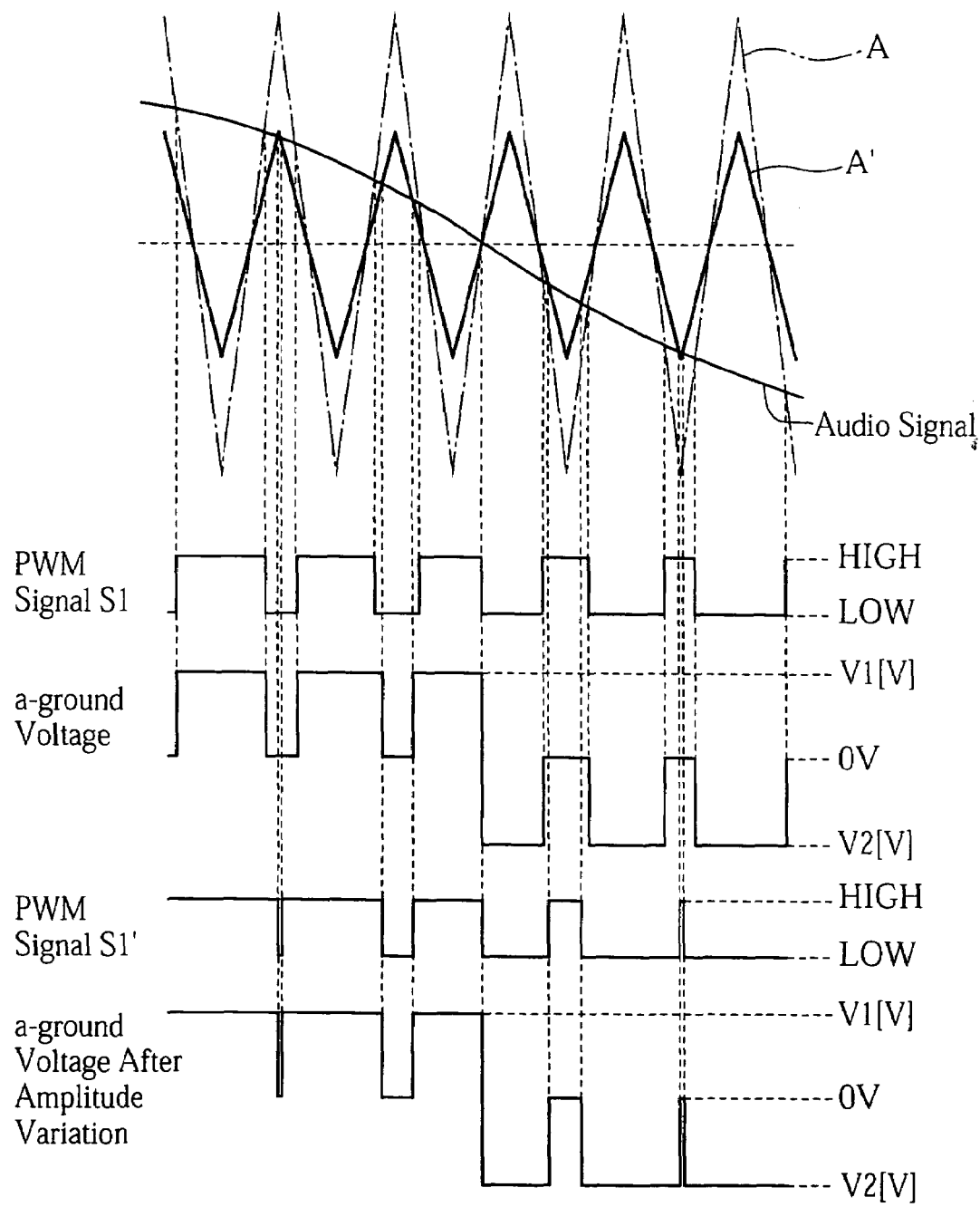
FIG. 19 is a waveform chart of outputs from the power amplifying circuit in FIG. 18.
Figure 20:
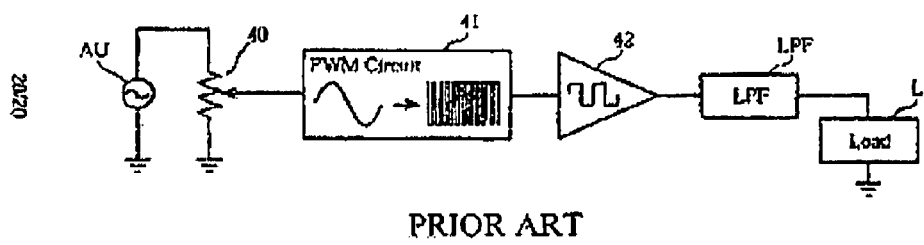
FIG. 20 is a block diagram of a switching amplifier including a conventional PWM circuit.

With such an arrangement again, when there is an input of a volume control signal from outside to the triangular wave generation circuit 38, the amplitude of a triangular wave A is varied as shown in FIG. 19. A triangular wave A' whose amplitude has been varied is then inputted to the first comparison circuit 12 for comparison with the audio signal. As a result, the first comparison circuit 12 outputs a first PWM signal S1' which has a slightly longer width in its HIGH level duration for positive signal input and a slightly longer width in its LOW level duration for negative signal input, than does the first PWM signal S1 which is the signal before the amplitude change. Since the PWM signal S1' controls the ON-OFF action of the switches SW3, SW4 in the power amplifying circuit 2, the output voltage difference between the first power amplifying circuit 2a and the ground is as represented by "a-ground Voltage After Amplitude Variation" in FIG. 19. Thus, it is possible to vary the voltage level to be supplied to the load L, and to achieve the same advantages as in the fourth embodiment, i.e. simplified circuit and reduced cost on the parts.

The fifth embodiment may further include the integrating circuit 31 and the sample hold circuit 32 as described in the second embodiment for removing impulse noise from audio signals.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

The invention claimed is:

1. A pulse-width modulation circuit connected to a power amplifying circuit including a plurality of switches operated to vary duration of power application to a load, the modulation circuit convening an input signal into a pulse signal to be supplied to the power amplifying circuit, the modulation circuit comprising:
a comparison signal generator that generates a comparison signal having a prescribed period;
an amplitude controller that controls an amplitude of the comparison signal in accordance with a volume control signal differing from power voltage; and
a comparator that compares the comparison signal and the input signal after the amplitude of the comparison signal is controlled; and
a noise remover for removing noise from the input signal;
wherein the comparator outputs a signal having a level inverted in accordance with a relative level of the input signal with respect to the comparison signal, the outputted signal being supplied to the power amplifying circuit; and
wherein the noise remover includes an integrating circuit that performs integration on the input signal and a sample hold circuit that performs sample-holding on the integrated input signal.

2. The pulse-width modulation circuit according to claim 1,
wherein the comparison signal is a triangular wave signal.

3. The pulse-width modulation circuit according to claim 1,
further comprising at least one additional comparator connected to the comparison signal generator;
wherein the additional comparator receives an additional input signal and compares the comparison signal generated by the comparison signal generator and the additional input signal after the amplitude of the comparison signal is controlled; and
wherein the additional comparator outputs a signal having a level inverted in accordance with a relative level of the additional input signal with respect to the comparison signal, the outputted signal being supplied to an additional power amplifying circuit.

4. A pulse-width modulation circuit connected to a power amplifying circuit including a plurality of switches operated to vary duration of power application to a load, the modulation circuit converting an input signal into a pulse signal to be supplied to the power amplifying circuit, the modulation circuit comprising:
a comparison signal generator that generates a comparison signal having a prescribed period;
an amplitude controller that controls an amplitude of the comparison signal in accordance with a volume control signal differing from power voltage;
a first comparator that compares the comparison signal and the input signal after the amplitude of the comparison signal is controlled, the first comparator outputting a signal having a level inverted in accordance with a relative level of the input signal with respect to the comparison signal;
an input signal inverter for inverting the input signal;
a second comparator tat compares the comparison signal and the inverted input signal after the amplitude of the comparison signal is controlled, the second comparator outputting a signal having a level inverted in accordance with a relative level of the input signal with respect to the comparison signal; and
a noise remover for removing noise from the input signal;
wherein the signal outputted from the first comparator and the signal outputted from the second comparator are supplied to the power amplifying circuit; and
wherein the noise remover includes an integrating circuit that performs integration on the input signal and a sample hold circuit that performs sample-holding on the integrated input signal.

5. The pulse-width modulation circuit according to claim 4,
wherein the comparison signal is a sawtooth wave signal.

6. A pulse-width modulation circuit connected to a power amplifying circuit including a plurality of switches operated to vary duration of power application to a load, the modulation circuit converting an input signal into a pulse signal to be supplied to the power amplifying circuit, the modulation circuit comprising:

a comparison signal generator that generates a comparison signal having a prescribed period;

an amplitude controller that controls an amplitude of the comparison signal in accordance with a volume control signal differing from power voltage;

a first comparator that compares the comparison signal and the input signal after the amplitude of the comparison signal is controlled, the first comparator outputting a signal having level inverted in accordance with a relative level of the input signal with respect to the comparison signal, the signal outputted from the first comparator being supplied to the power amplifying circuit;

an input signal inverter for inverting the input signal;

a second comparator that compares the comparison signal and the inverted input signal after the amplitude of the comparison signal is controlled, the second comparator outputting a signal having level inverted in accordance with a relative level of the input signal with respect to the comparison signal, the signal outputted from the second comparator being supplied to the power amplifying circuit;

at least one additional first comparator connected to the comparison signal generator;

at least one additional second comparator connected to the comparison signal generator; and at least one additional input signal inverter connected to the additional second comparator;

wherein the additional first comparator receives an additional input signal and compares the comparison signal and the additional input signal after the amplitude of the first comparison signal is controlled, the additional first comparator outputting a signal having a level inverted in accordance with a relative level of the additional input signal with respect to the comparison signal, the outputted signal being supplied to an additional power amplifying circuit;

wherein the additional input signal inverter inverts the additional input signal; and wherein the additional second comparator compares the comparison signal and the inverted additional input signal after the amplitude of the comparison signal is controlled, the additional second comparator outputting a signal having a level inverted in accordance with a relative level of the inverted additional input signal with respect to the comparison signal, the outputted signal being supplied to the additional power amplifying circuit.

7. A pulse-width modulation circuit connected to a power amplifying circuit including a plurality of switches operated to vary duration of power application to a load, the modulation circuit converting an input signal into a pulse signal to be supplied to the power amplifying circuit, the modulation circuit comprising:

a first comparison signal generator that generates a first comparison signal having a prescribed period;

a second comparison signal generator that generates a second comparison signal having the same period as the first comparison signal, the second comparison signal being in inverted relation to the first comparison signal;

an amplitude controller that controls an amplitude of the first comparison signal and an amplitude of the second comparison signal;

a first comparator that compares the first comparison signal and the input signal after the amplitude of the first comparison signal is controlled; and a second comparator that compares the second comparison signal and the input signal after the amplitude of the second comparison signal is controlled;

wherein the first comparator outputs a signal having a level inverted in accordance with a relative level of the input signal with respect to the first comparison signal, the outputted signal being supplied to the power amplifying circuit;

wherein the second comparator outputs a signal having a level inverted in accordance with a relative level of the input signal with respect to the second comparison signal, the outputted signal being supplied to the power amplifying circuit.

8. The pulse-width modulation circuit according to claim 7, wherein each of the first comparison signal and the second comparison signal is a sawtooth wave signal.

9. The pulse-width modulation circuit according to claim 7, further comprising a noise remover for removing noise from the input signal.

10. The pulse-width modulation circuit according to claim 7, wherein the noise remover includes an integrating circuit tat performs integration on the input signal and a sample hold circuit that performs sample-holding on the integrated input signal.

11. The pulse-width modulation circuit according to claim 7, further comprising at least one additional first comparator and at least one additional second comparator, the additional first comparator being connected to the first comparison signal generator, the additional second comparator being connected to the second comparison signal generator, the additional first comparator and the additional second comparator receiving an additional input signal;

wherein the additional first comparator compares the first comparison signal and the additional input signal after the amplitude of the first comparison signal is controlled, the additional second comparator comparing the second comparison signal and the additional input signal after the amplitude of the second comparison signal is controlled;

wherein the additional first comparator outputs a signal having a level inverted in accordance with a relative level of the additional input signal with respect to the first comparison signal, the outputted signal being supplied to an additional power amplifying circuit; and wherein the additional second comparator outputs a signal having a level inverted in accordance with a relative level of the additional input signal with respect to the second comparison signal, the outputted signal being supplied to the additional power amplifying circuit.

12. A switching amplifier comprising a pulse-width modulation circuit connected to a power amplifying circuit including a plurality of switches operated to vary duration of power application to a load, the modulation circuit converting an input signal into a pulse signal to be supplied to the power amplifying circuit, the modulation circuit comprising:

a first comparison signal generator that generates a first comparison signal having a prescribed period;

a second comparison signal generator that generates a second comparison signal having the same period as the first comparison signal, the second comparison signal being in inverted relation to the first comparison signal;

an amplitude controller that controls an amplitude of the first comparison signal and an amplitude of the second comparison signal;

a first comparator that compares the first comparison signal and the input signal after the amplitude of the first comparison signal is controlled; and a second comparator tat compares the second comparison signal and the input signal after the amplitude of the second comparison signal is controlled;

wherein the first comparator outputs a signal having a level inverted in accordance with a relative level of input signal with respect to die first comparison signal, the outputted signal being supplied to the power amplifying circuit;

wherein the second comparator outputs a signal having a level inverted in accordance with a relative level of the input signal with respect to the second comparison signal, the outputted signal being supplied to the power amplifying circuit.

* * * * *